US009070640B2

(12) United States Patent
Gwak

(10) Patent No.: US 9,070,640 B2
(45) Date of Patent: Jun. 30, 2015

(54) METHOD OF FORMING FINE PATTERNS OF SEMICONDUCTOR DEVICE

(71) Applicant: SAMSUNG ELECTRONICS CO., LTD., Suwon-Si, Gyeonggi-Do (KR)

(72) Inventor: Byoung-Yong Gwak, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 37 days.

(21) Appl. No.: 14/079,658

(22) Filed: Nov. 14, 2013

(65) Prior Publication Data

US 2014/0273471 A1  Sep. 18, 2014

(30) Foreign Application Priority Data

Mar. 15, 2013 (KR) ........................ 10-2013-0028068

(51) Int. Cl.
H01L 21/4763 (2006.01)
H01L 21/311 (2006.01)
H01L 21/033 (2006.01)
H01L 27/108 (2006.01)
H01L 27/115 (2006.01)

(52) U.S. Cl.
CPC ...... *H01L 21/31144* (2013.01); *H01L 21/0337* (2013.01); *H01L 27/1158* (2013.01); *H01L 27/10852* (2013.01)

(58) Field of Classification Search
None
See application file for complete search history.

(56) References Cited

U.S. PATENT DOCUMENTS

| 4,988,609 A | 1/1991 | Hashimoto et al. |
| 7,776,750 B2 | 8/2010 | Kim |
| 8,012,881 B1 | 9/2011 | Lee et al. |
| 8,278,221 B2 | 10/2012 | Koh et al. |
| 2011/0294297 A1 | 12/2011 | Sukekawa |
| 2011/0312184 A1 | 12/2011 | Lee et al. |

FOREIGN PATENT DOCUMENTS

| KR | 10-2009-0070686 A | 7/2009 |
| KR | 10-2011-0101404 A | 9/2011 |
| KR | 10-1004513 B1 | 12/2012 |

*Primary Examiner* — Yasser A Abdelaziez

(74) *Attorney, Agent, or Firm* — Volentine & Whitt, PLLC

(57) ABSTRACT

A method of forming fine patterns includes patterning a hard mask layer and a buffer mask layer sequentially stacked on a lower mask layer to form first openings, forming sacrificial patterns filling the first openings and protruding from a top surface of the buffer mask layer, forming a spacer pattern filling a space between two adjacent sacrificial patterns and having gaps each of which exposes a portion of the buffer mask layer between at least three adjacent sacrificial patterns, etching portions of the buffer mask layer exposed by the gaps of the spacer pattern to form enlarged holes, etching portions of the hard mask layer exposed by the enlarged holes to form second openings, and subsequently etching the lower layer using the hard mask layer as an etch mask.

20 Claims, 32 Drawing Sheets

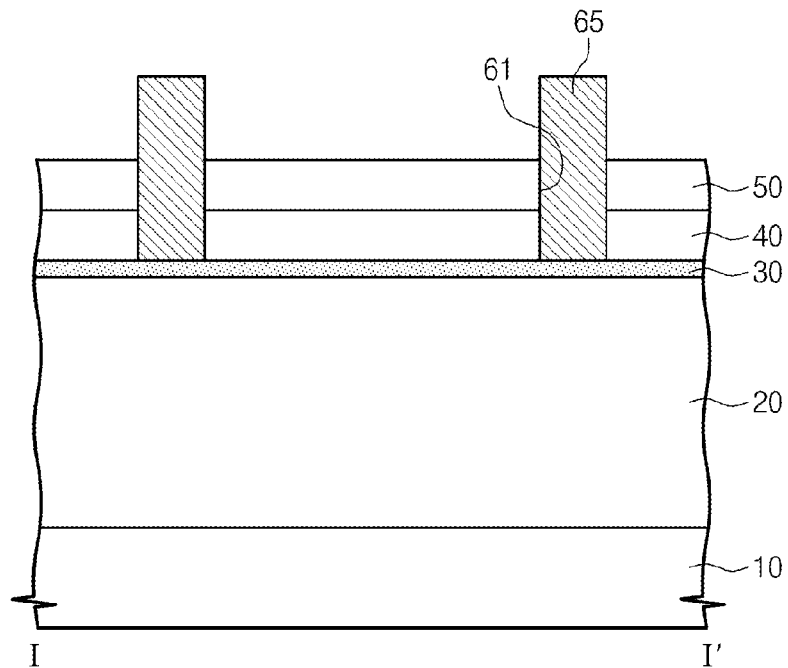
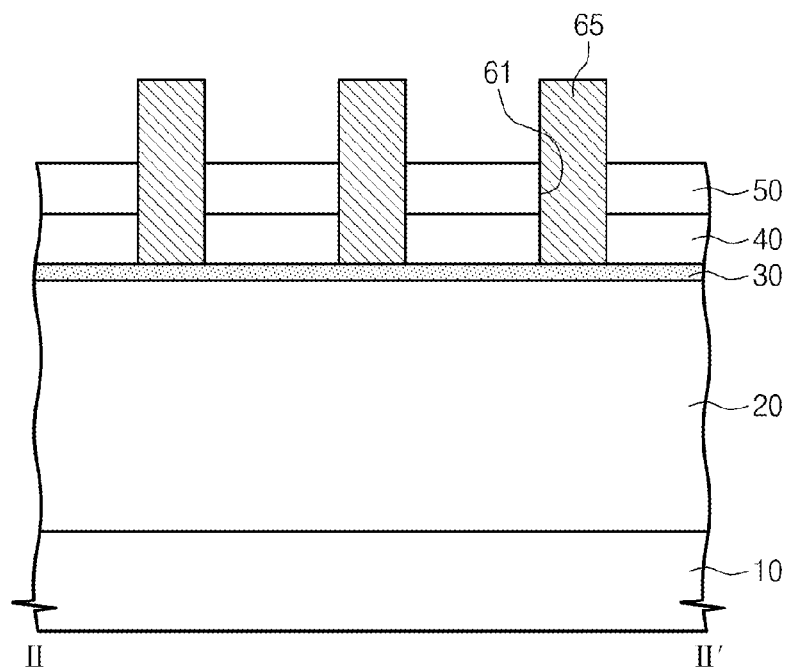

METHOD OF FORMING FINE PATTERNS OF SEMICONDUCTOR DEVICE

PRIORITY STATEMENT

This U.S. non-provisional patent application claims priority under 35 U.S.C. §119 to Korean Patent Application No. 10-2013-0028068, filed on Mar. 15, 2013, in the Korean Intellectual Property Office, the disclosure of which is hereby incorporated by reference in its entirety.

BACKGROUND

The inventive concepts relate to methods of forming fine patterns of a semiconductor device.

The design rules of a semiconductor device set the sizes of various elements and features of the device. Recently, with the demand for more highly integrated semiconductor devices the design rules of the devices have been increasing rapidly. Furthermore, fine patterns are necessary to manufacture highly integrated semiconductor devices. Such fine patterns, for example, are necessary to form many discrete elements in a small area, i.e., to provide a pattern of discrete elements having a small pitch wherein the pitch corresponds to the sum of a width of each element and the distance between the elements. A well known technique for forming fine patterns is photolithography. However, there are inherent limitations on the resolution of photolithography processes which, in turn, limit the fineness of patterns of semiconductor memory devices that can be realized by photolithography alone.

SUMMARY

According to an aspect of the inventive concept there is provided a method of forming fine patterns, in which a structure including a lower mask layer, a hard mask layer stacked on the lower mask layer and a buffer mask layer stacked on the hard mask layer is provided; the hard mask layer and the buffer mask layer are patterned to form first openings therein; sacrificial patterns filling the first openings and protruding from a top surface of the buffer mask layer are formed; a spacer pattern is formed to fill spaces between sacrificial patterns adjacent to each other and having gaps therein, each of the gaps exposing a respective portion of the buffer mask layer located in a central region of a polygon whose vertices coincide with the locations of sacrificial patterns adjacent to each other, respectively; portions of the buffer mask layer exposed by the gaps of the spacer pattern are etched to form holes therein that expose the hard mask layer; portions of the hard mask layer exposed by the holes in the buffer mask layer are etched to form second openings in the hard mask layer; and the lower layer is subsequently etched using the hard mask as an etch mask.

According to another aspect of the inventive concept, there is provided a method of forming fine patterns, in which a structure including a lower mask layer, a hard mask layer stacked on the lower mask layer and a buffer mask layer stacked on the hard mask layer is provided; the hard mask layer and the buffer mask layer are patterned to form first openings therein; sacrificial patterns filling the first openings and protruding from a top surface of the buffer mask layer are formed; a spacer pattern is formed to fill spaces between sacrificial patterns adjacent to each other and have gaps therein, each of the gaps exposing a respective portion of the buffer mask layer located in a central region of a polygon whose vertices coincide with the locations of sacrificial patterns adjacent to each other, respectively; the buffer mask layer exposed by the gaps of the spacer pattern is anisotropically etched to form holes in the buffer mask layer; the buffer mask layer is isotropically etched to enlarge the holes in the buffer mask layer; the spacer pattern is removed; subsequently, the hard mask layer is anisotropically etched through the enlarged holes to form second openings in the hard mask layer; and subsequently, the lower layer is anisotropically etched using the hard mask layer as an etch mask.

In some embodiments, a width of each of the gap regions in the spacer pattern may be in the range of about ⅓ to about ¹/₁₀ of a width of each of the first openings.

In some embodiments, a width of each of the enlarged holes formed in the buffer mask layer may be greater than a width of each of the gap regions of the spacer pattern.

In some embodiments, forming the enlarged holes may include: anisotropically etching the portions of the buffer mask layer exposed by the gap regions of the spacer pattern to form holes exposing a top surface of the hard mask layer; and isotropically etching the buffer mask layer exposed by the holes to enlarge widths of the holes.

In some embodiments, forming the spacer pattern may include: forming a spacer layer conformally covering the sacrificial patterns on the buffer mask layer, the spacer layer including a recess region between at least three sacrificial patterns adjacent to each other; and anisotropic ally etching the spacer layer until top surfaces of the sacrificial patterns are exposed.

According to still another aspect of the inventive concept, there is provided a method of forming a semiconductor device, in which a target structure having a first layer disposed thereon and a second layer disposed on the first layer is provided; an array of openings through the second layer is formed using photolithography and etching processes; sacrificial patterns that have the form of pillars and occupy the openings, respectively, are formed such that each of the sacrificial patterns has an upper portion protruding above a top surface of the second layer; a spacer layer is conformally formed on the protruding upper portions of the sacrificial patterns to such a thickness that the spacer layer has a portion spanning the upper portions of the sacrificial patterns and recesses are defined by the conformal spacer layer at locations between the sacrificial patterns as viewed in plan; the spacer layer is etched to extend the recesses and thereby form gaps that expose the top surface of the second layer; the second layer is etched through the gaps to form holes in the second layer; the second layer is isotropically etched to enlarge the holes in the second layer; the target structure is etched using an etch mask comprising the second layer having the enlarged holes to extend the enlarged holes into the target structure; and components of the semiconductor device are formed in the holes in the target structure.

BRIEF DESCRIPTION OF THE DRAWINGS

The inventive concepts will become more apparent in view of the attached drawings and accompanying detailed description.

DETAILED DESCRIPTION OF THE PREFERRED EMBODIMENTS

Figure 1A:
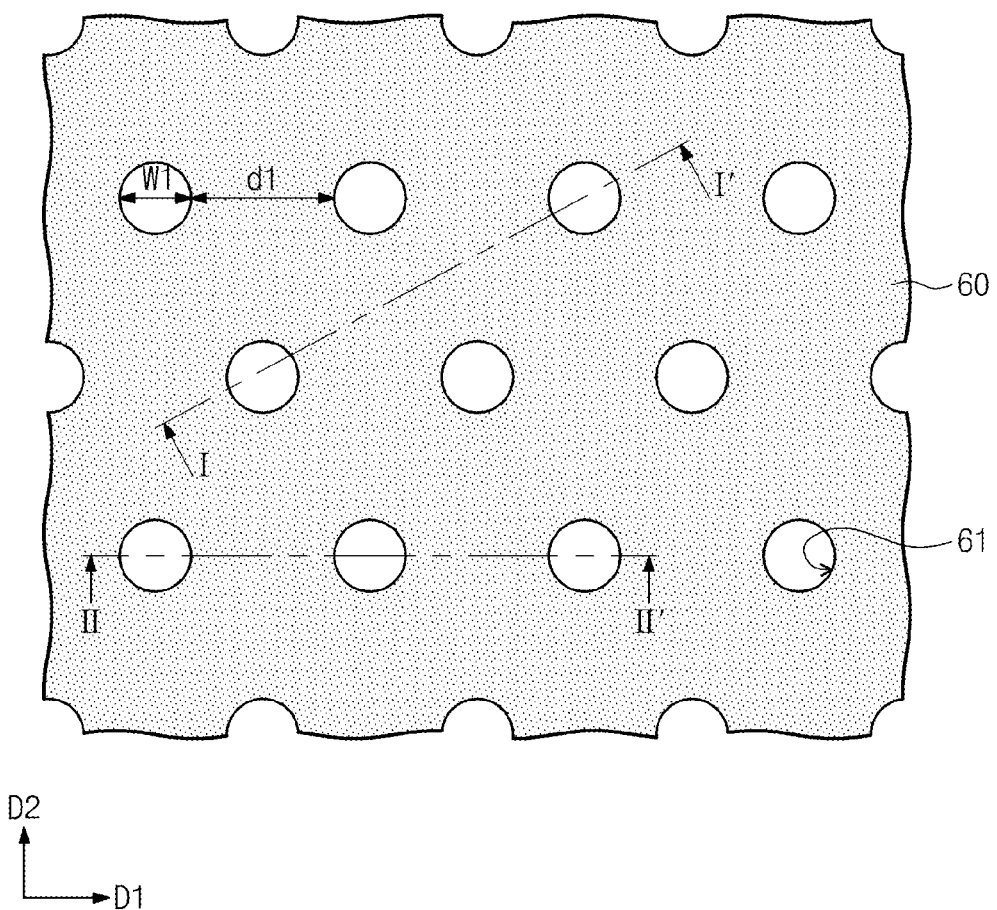
FIGS. 1A to 7C illustrate an embodiment of a method of forming fine patterns according to the inventive concept, with FIGS. 1A, 2A, 3A, 4A, 5A, 6A and 7A each being a plan view of device structure during the course of the method, FIGS. 1B, 2B, 3B, 4B, 5B, 6B and 7B each being a sectional view taken along lines I-I' of FIGS. 1A, 2A, 3A, 4A, 5A, 6A and 7A, respectively, and FIGS. 1C, 2C, 3C, 4C, 5C, 6C and 7C being cross-sectional views taken along lines II-IF of FIGS. 1A, 2A, 3A, 4A, 5A, 6A and 7A, respectively.

Various embodiments and examples of embodiments of the inventive concept will be described more fully hereinafter with reference to the accompanying drawings. In the drawings, the sizes and relative sizes and shapes of elements, layers and regions shown in section may be exaggerated for clarity. In particular, the cross-sectional illustrations of the semiconductor devices and intermediate structures fabricated during the course of their manufacture are schematic. Also, like numerals are used to designate like elements throughout the drawings. Furthermore, in some embodiments, a detailed description of steps that are similar to those which were described in detail with respect to a previous embodiment may be omitted for the sake of brevity.

It will also be understood that when an element or layer is referred to as being disposed or stacked "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The term "pattern" may be used to refer to an array of features or elements or an individual one of such features or elements whose form is repeated, as the context will make clear. The term "width" will generally refer to the dimension of a feature or element as viewed in plan in a give direction and will be understood to be the diameter of that feature or element when the feature or element is disclosed as being circular. The phrase "patterns adjacent to each other" or the like will refer to patterns that are next to each other in any given direction or directions without any other like pattern being interposed therebetween.

A first embodiment of a method of forming fine patterns according to the inventive concept will now be described in detail with reference to FIGS. 1A to 7C.

Figure 1B:
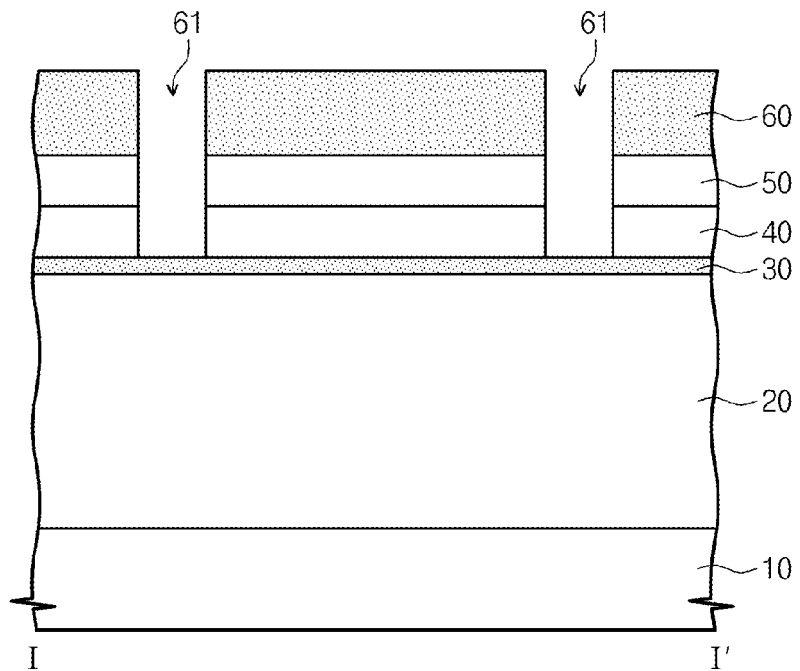
Figure 1C:
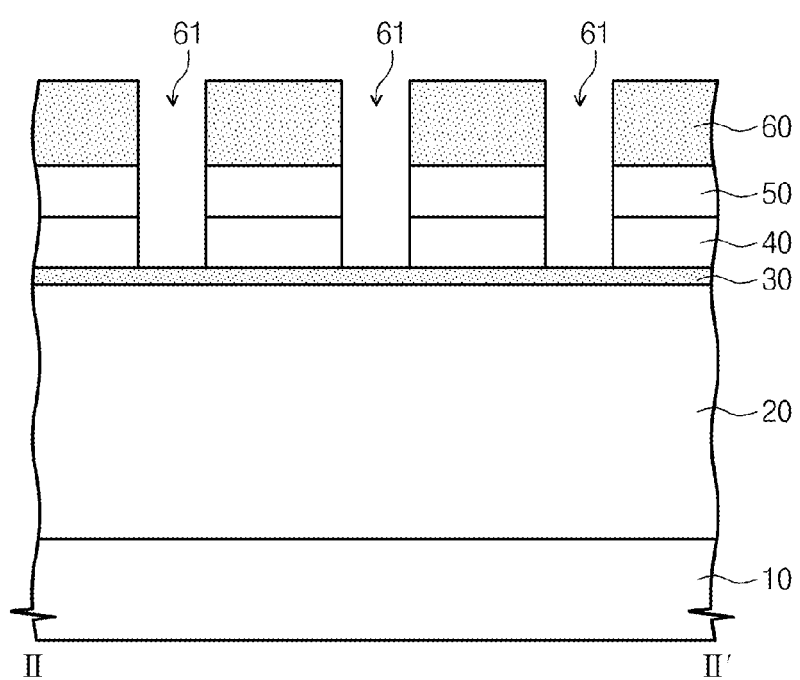

Referring to FIGS. 1A, 1B, and 1C, a lower layer 20, a hard mask layer 40, and a buffer mask layer 50 are sequentially formed on a substrate 10. In the illustrated embodiment, an etch stop layer 30 is formed on the lower layer so as to become located between the lower layer 20 and the hard mask layer 40.

The lower layer 20 may include at least one of a semiconductor pattern, a conductive pattern, and an insulating pattern. That is, the lower layer 20 may be formed of a semiconductor material, a conductive material, an insulating material, or any combination thereof. For example, the lower layer 20 may be a portion of a semiconductor substrate or an epitaxial layer the case in which the lower layer 20 is formed of the semiconductor material. For example, the lower layer 20 may be formed of a doped poly-silicon, a metal silicide, a metal, a metal nitride, or any combination thereof in the case in which the lower layer 20 is formed of the conductive material. For example, the lower layer 20 may be formed of silicon oxide, silicon nitride, silicon oxynitride, or a low-k dielectric material in the case in which the lower layer 20 is formed of the insulating material.

More specifically, the lower layer 20 may be formed of crystalline silicon, amorphous silicon, doped silicon, silicon-germanium, or a carbon-based material. Also, the lower layer 20 may consist of a single layer of material or may be a laminate including a plurality of stacked layers of different materials. For example, the lower layer 20 may include a plurality of stacked insulating layers. Additionally, the lower layer 20 may further include a respective conductive layer or a semiconductor layer that is interposed between the stacked insulating layers of at least one pair of adjacent insulating layers in the stack.

The etch stop layer 30 in this example is formed of a material having an etch selectivity with respect to the lower layer 20 and the hard mask layer 40. Thus, the etch stop layer 30 may be formed of one material selected from a group consisting of silicon oxide ($SiO_2$), silicon oxynitride (SiON), silicon nitride ($Si_3N_4$), silicon-carbon nitride (SiCN), and silicon carbide (SiC).

The hard mask layer 40 in this example is formed of a material having an etch selectivity with respect to the lower layer 20. The hard mask layer 40 may also consist of a single layer of material or may be a laminate including a plurality of stacked layers of different materials. For example, the hard mask layer 40 may include at least one silicon-based material selected from the group consisting of poly-silicon, silicon oxynitride (SiON), silicon nitride ($Si_3N_4$), and silicon-carbon nitride (SiCN). Alternatively, the hard mask layer 40 may include a spin-on-hardmask (SOH) layer or an amorphous carbon layer (ACL). The SOH layer may include a carbon-based SOH layer or a silicon-based SOH layer. The hard mask layer 40 may be formed to a thickness depending on the thickness and/or composition of the lower layer 20.

The buffer mask layer 50 in this example is formed of a material having an etch selectivity with respect to the hard mask layer 40. For example, the buffer mask layer 50 may be formed of one material selected from the group consisting of silicon, poly-silicon, silicon oxide ($SiO_2$), silicon oxynitride (SiON), silicon nitride ($Si_3N_4$), silicon-carbon nitride (SiCN), and silicon carbide (SiC).

Referring again to FIGS. 1A, 1B, and 1C, in this embodiment, a mask pattern 60 for forming first openings 61 is formed on the buffer mask layer 50.

The mask pattern 60 may be formed using a photolithography process. For example, the mask pattern 60 may be a photoresist layer, a SOH layer, or an amorphous carbon layer (ACL). The minimal width and pitch of the openings are dependent on the limits on the resolution which can be achieved in the photolithography process. Additionally, the mask pattern 60 is formed to a thickness designed to establish a desired height of sacrificial patterns formed in a subsequent process (designated by reference numeral 65 in FIGS. 2A, 2B, and 2C).

The buffer mask layer 50 and the hard mask layer 40 are anisotropically etched using the mask pattern 60 as an etch mask. Thus, the first openings 61 are formed in the buffer mask layer 50 and the hard mask layer 40.

In the illustrated embodiment, the first openings 61 are arranged in rows and columns extending in first and second directions D1 and D2 perpendicular to each other, respectively, in a plan view. Furthermore, the distances between the centers of adjacent first openings 61 in each row, i.e., in direction D1, are substantially uniform. Likewise, the distances between the centers of adjacent first openings 61 in each column, i.e., in each column, are substantially uniform. The pitch of the openings 61 in the direction D1 is less than the pitch of the openings 61 in the second direction D2, i.e., the distances between adjacent ones of the first openings 61 in each row of openings 61 are respectively less than the distances between adjacent ones of the first openings 61 in each column of openings 61. Moreover, the openings 61 in each row are not aligned in the second direction D2 with any of the openings 61 in each row adjacent thereto. Likewise, the openings 61 in each column are not aligned in the first direction D2 with any of the openings 61 in each column adjacent thereto. In other words, the openings 61 in each row (or column) are offset in the first direction D1 (or D2) from the openings 61 in each row (or column) adjacent thereto. Additionally, the minimum distance d1 between any two first openings 61 in the illustrated embodiment is greater than the width W1 of each first opening 61.

Figure 21:
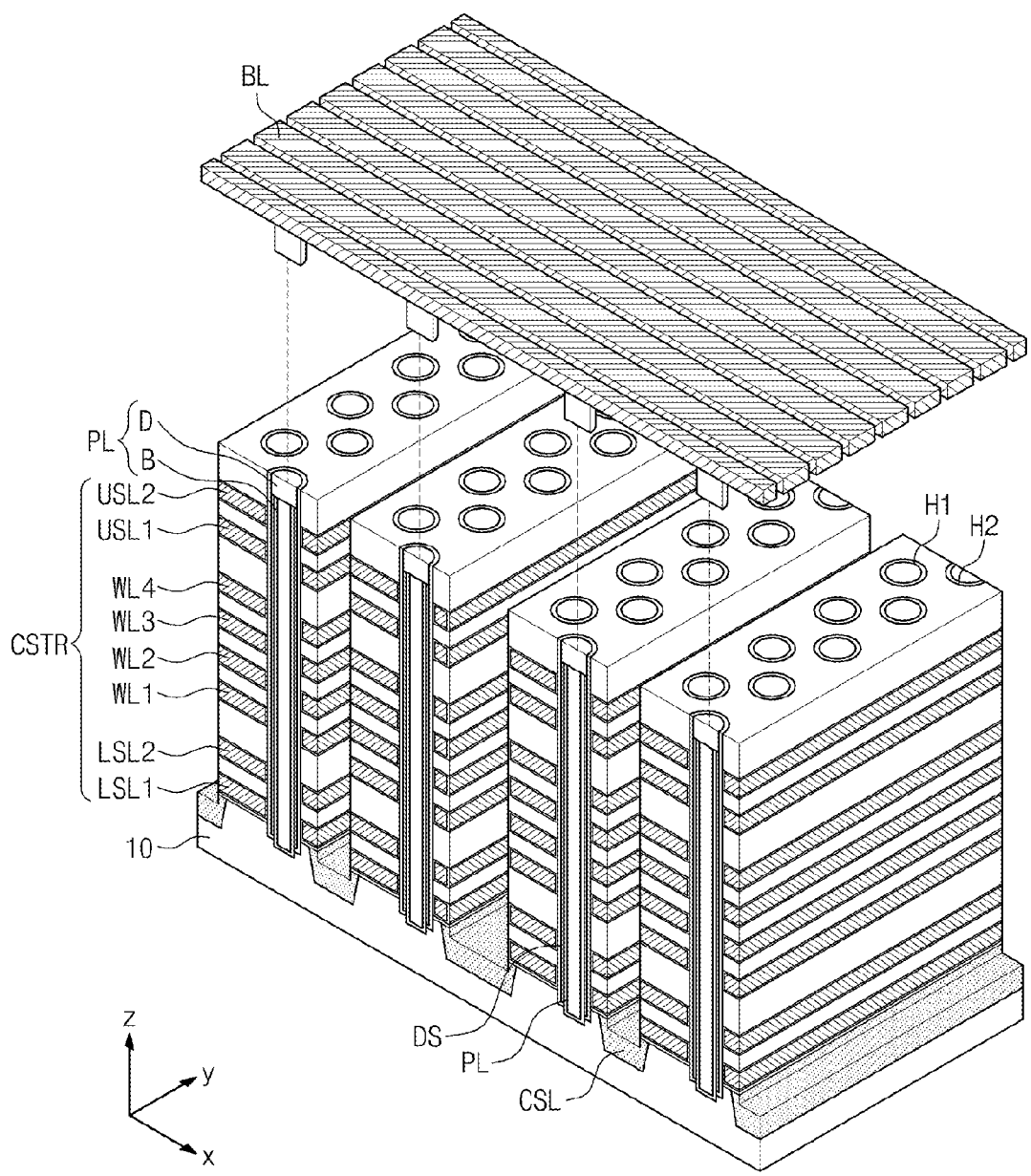
FIG. 21 is a perspective view of a three-dimensional (3D) semiconductor memory device formed using a method of forming fine patterns according to the inventive concept.

Thus, in particular, in this embodiment, the first openings 61 have the pattern of a honeycomb or a pattern of zigzags (with each zigzag the second direction D2 or the y-direction in FIG. 21, for example) in a plan view. More specifically, in this embodiment for each set of three adjacent rows of the openings 61, there are groups of six openings 61 and in each such group, the six openings 61 lie at the vertices of a hexagon (the cell of a honeycomb). Also, for each set of three adjacent rows of the openings 61, there are groups of five openings 61 and in each such group, the five openings lie along a letter Z. On the other hand, for each set of five adjacent columns of the openings 61, there are groups of six openings 61 and in each such group, the six openings 61 lie at the vertices of a hexagon (the cell of a honeycomb). Also, for each set of three adjacent columns of the openings 61, there are groups of five openings 61 and in each such group, the five openings lie along a letter Z.

Figure 2A:
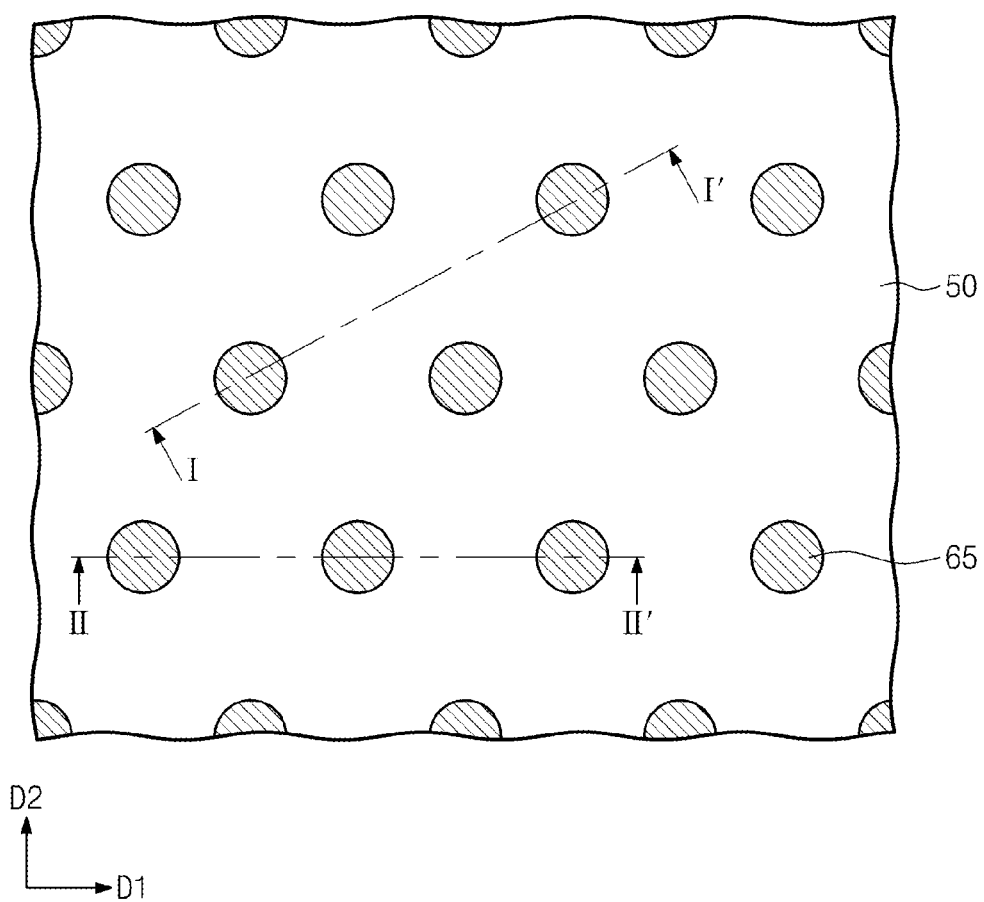

Referring now to FIGS. 2A, 2B, and 2C, sacrificial patterns 65 are formed to fill the first openings 61, respectively.

Forming the sacrificial patterns 65 includes depositing a sacrificial layer filling the first openings 61 on the mask pattern 60, and planarizing the sacrificial layer until a top surface of the mask pattern 60 is exposed. The sacrificial patterns 65 may be formed of a material having an etch selectivity with respect to the hard mask layer 40 and the mask pattern 60. The sacrificial patterns 65 may be formed of a different material from the buffer mask layer 50 or may be formed of the same material as the buffer mask layer 50. For example, the sacrificial patterns 65 may be formed of one material selected from the group consisting of silicon, poly-silicon, silicon oxide ($SiO_2$), silicon oxynitride (SiON), silicon nitride ($Si_3N_4$), silicon-carbon nitride (SiCN), and silicon carbide (SiC).

After the sacrificial patterns 65 are formed, the mask pattern 60 is removed to expose portions of sidewalls of the sacrificial patterns 65. Thus, the sacrificial patterns 65 protrude from a top surface of the buffer mask layer 50. In embodiments in which the mask pattern 60 is formed of the photoresist layer, the SOH layer, or the amorphous carbon layer (ACL), the mask pattern 60 may be removed using an ashing process and/or a strip process.

Figure 3A:
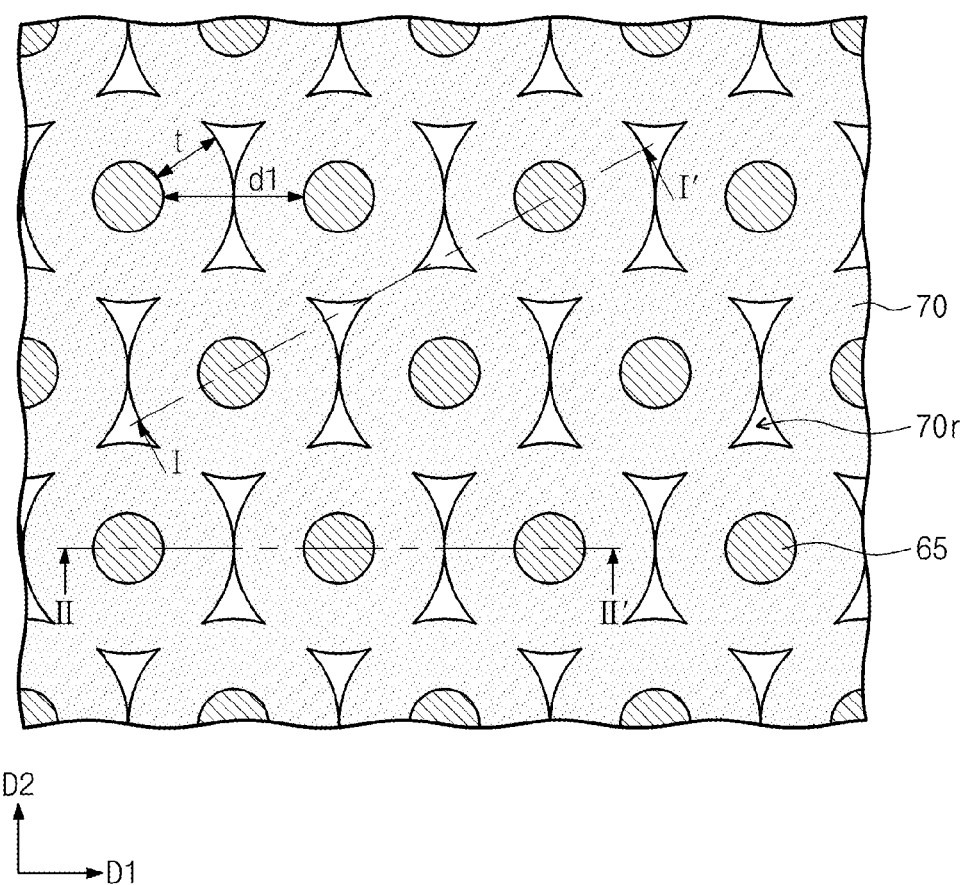
Figure 3B:
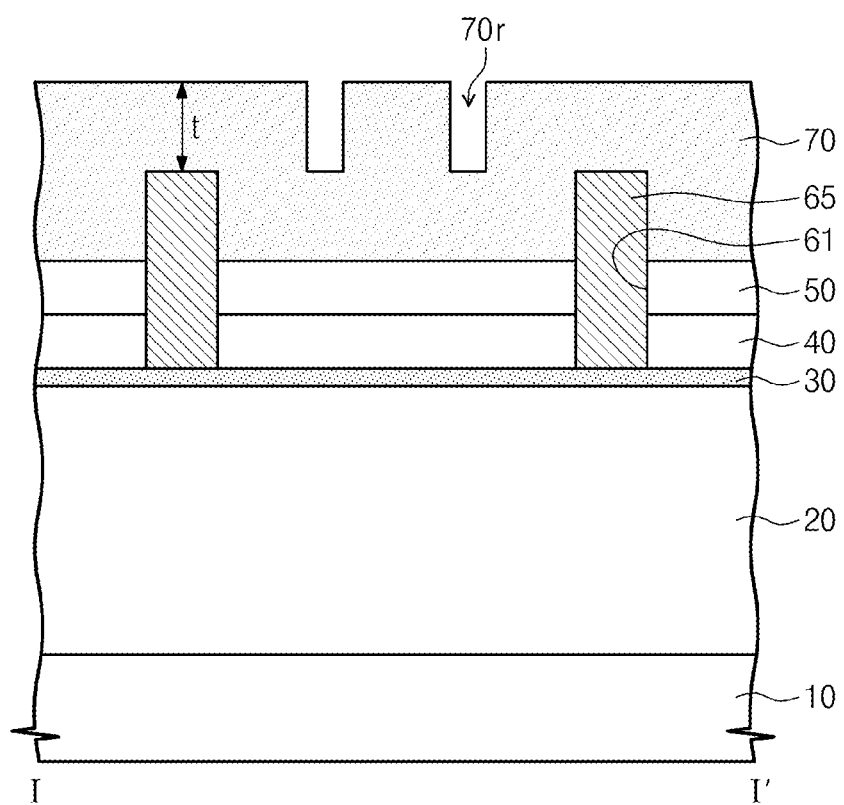
Figure 3C:
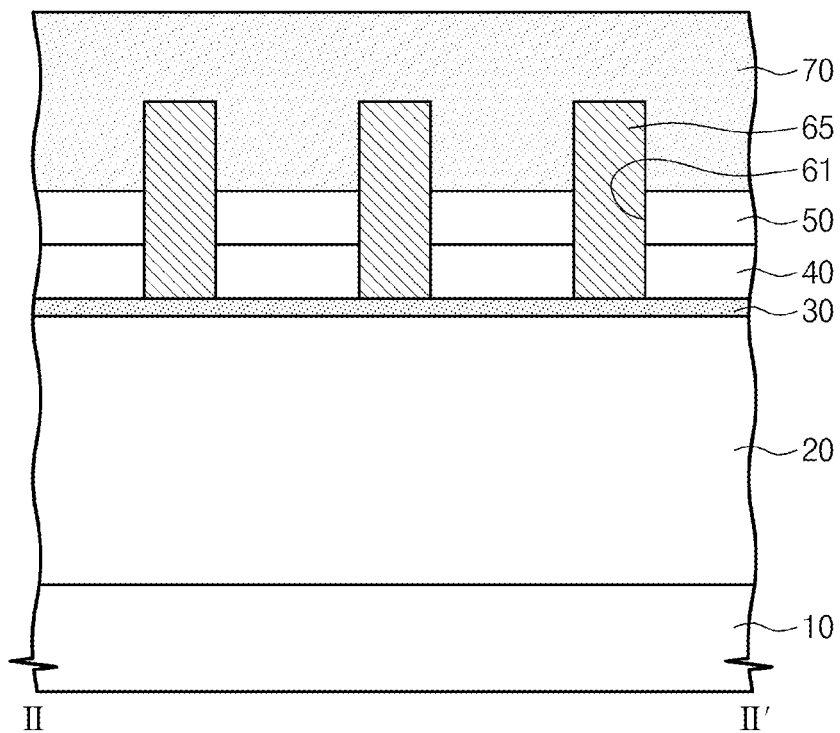

Referring to FIGS. 3A, 3B, and 3C, a spacer layer 70 is conformally formed on the buffer mask layer 50 and the protruding sacrificial patterns 65. Therefore, spacer layer 70 has a substantially uniform thickness t on the top surface and the sidewalls of the sacrificial patterns 65. The deposition thickness t of the spacer layer 70 is preferably equal to or greater than about ½ the smallest distance d1 between two sacrificial patterns 65. More preferably, the deposition thickness t of the spacer layer 70 is in the range of about ½ to about ¾ of the smallest distance d1 between the sacrificial patterns 65.

Also, the spacer layer 70 may be formed of a material having an etch selectivity with respect to the buffer mask layer 50 and the sacrificial patterns 65. The spacer layer 70 may be formed using a deposition technique such as a chemical vapor deposition (CVD) process and/or an atomic layer deposition (ALD) process.

The spacer layer 70 fills the spaces between the respective ones of the sacrificial patterns 65 closest to each other because the thickness t of the spacer layer 70 is equal to or greater than about ½ the smallest distance d1 between the sacrificial patterns 65. In this embodiment as shown in FIG. 3A, the spacer layer 70 fills all of the spaces between the sacrificial patterns 65 adjacent one another in the first direction D1 and the sacrificial patterns 65 adjacent one another in the diagonal direction. On the other hand, the spacer layer 70 may have recesses 70r between adjacent ones of the sacrificial patterns 65 that are spaced relatively far apart from each other, i.e., between the sacrificial patterns 65 in each column (direction D2). The spacer layer 70 may have a plurality of the recesses 70r between the sacrificial patterns 65 adjacent each other in each column of the sacrificial patterns. Seen another way, each recess 70r is located within a regular triangle whose vertices are occupied by three of the sacrificial patterns 65, respectively. The area of each recess 70r becomes smaller, though, as the thickness t of the spacer layer 70 increases.

Figure 4A:
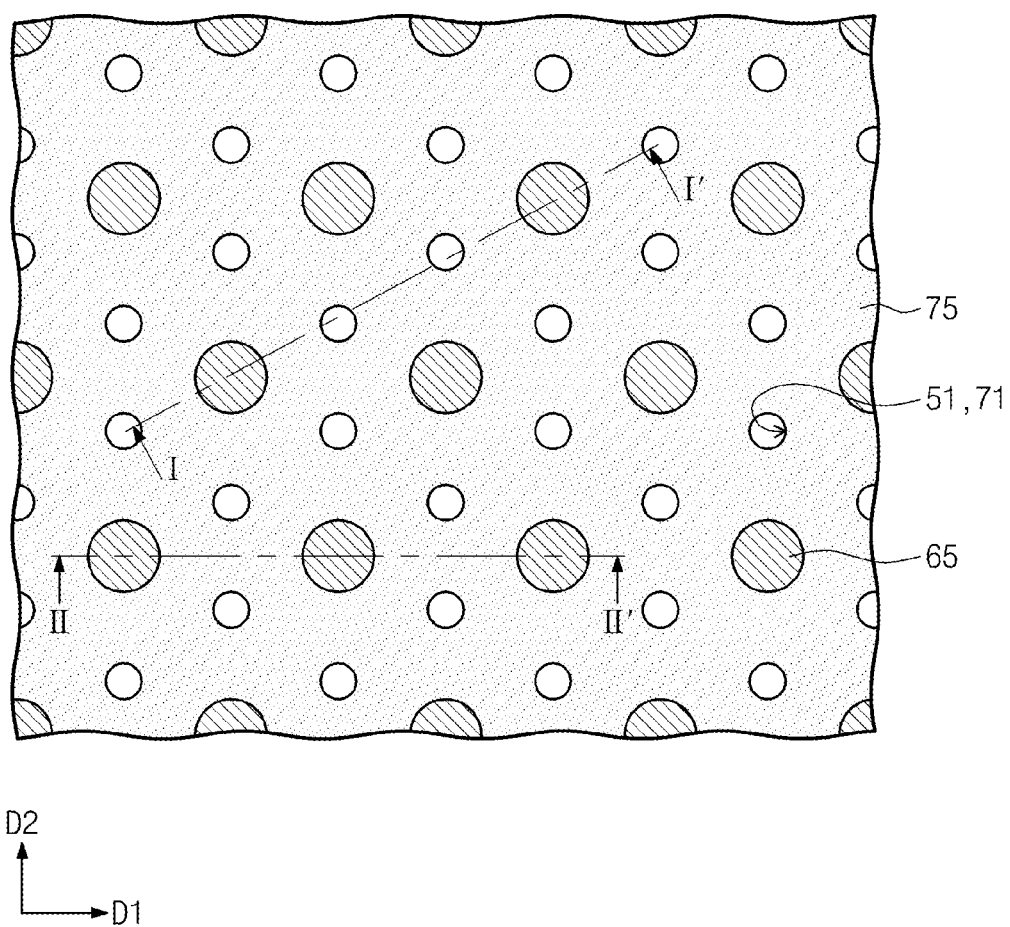
Figure 4B:
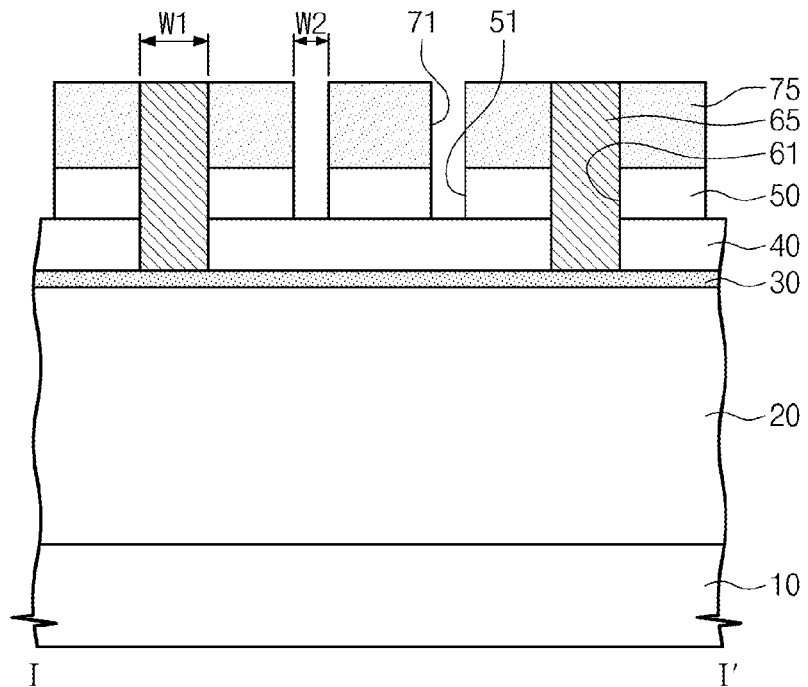
Figure 4C:
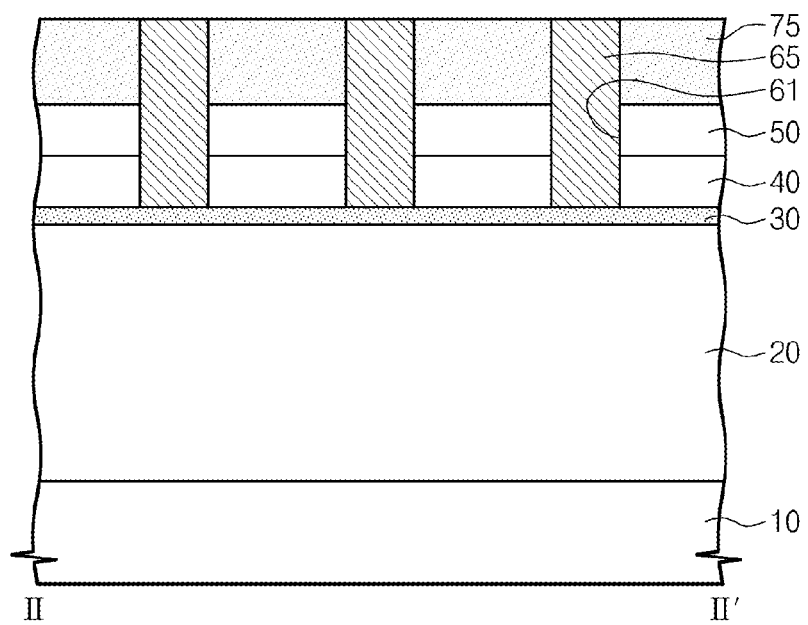

Referring to FIGS. 4A, 4B, and 4C, a blanket anisotropic etching process (e.g., an etch-back process) is performed on the spacer layer 70 until the top surfaces of the sacrificial patterns 65 are exposed. As a result, a spacer pattern 75 having gaps 71 exposing portions of the buffer mask layer 50 is formed. Each of the gaps 71 is formed within a regular triangle whose vertices are occupied by three adjacent sacrificial patterns 65, respectively. In other words, the gaps 71 are formed at approximately the same positions of the recess regions 70r, respectively. Additionally, the spacer pattern 75 may fill the spaces between the adjacent sacrificial patterns 65 in the first direction D1 and the diagonal direction.

Also, the gaps 71 of the spacer pattern 75 may be formed so as to be arranged in groups with the gaps 71 in each group being spaced regularly around a respective one of the sacrificial patterns 65. In the illustrated embodiment, the gaps 71 of each such group occupy the vertices of regular hexagon whose center is coincident with that of a respective sacrificial pattern.

Furthermore, the width W2 of each of the gaps 71 is less than the width W1 of each of the first openings 61 (i.e., the width of each of the sacrificial patterns 65). Preferably, the width W2 of each of the gaps 71 is in the range of about ⅓ to about ⅒ of the width W1 of each of the first openings 61.

Still referring to FIGS. 4A, 4B, and 4C, the buffer mask layer 50 exposed by the gaps 71 of the spacer pattern 75 is anisotropically etched. Thus, holes 51 exposing the hard mask layer 40 are formed in the buffer mask layer 50. Like the gaps 71, each of the holes 51 is located within a triangle whose vertices coincide with three adjacent sacrificial patterns 65. The width W2 of each of the holes 51 is less than the width W1 of each of the first openings 61. Preferably, the width W2 of each of the holes 51 may be in the range of about ⅓ to about ⅒ of the width W1 of each of the first openings 61.

Figure 5A:
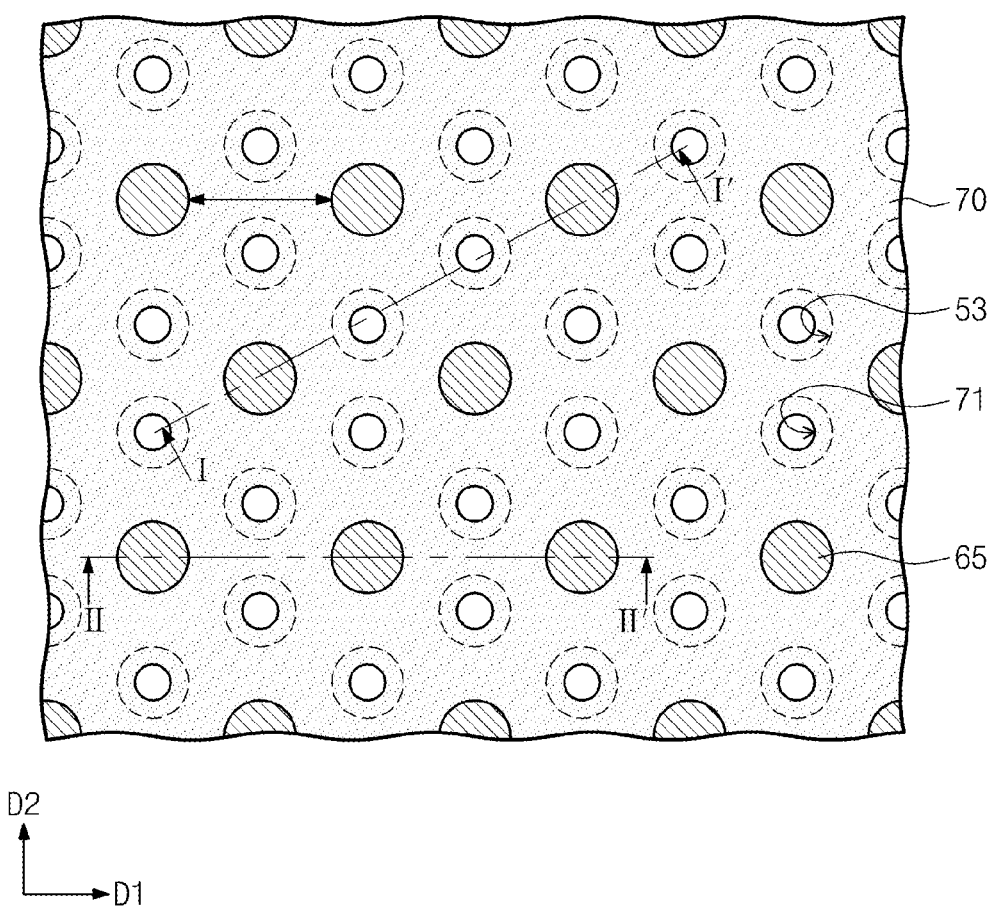
Figure 5B:
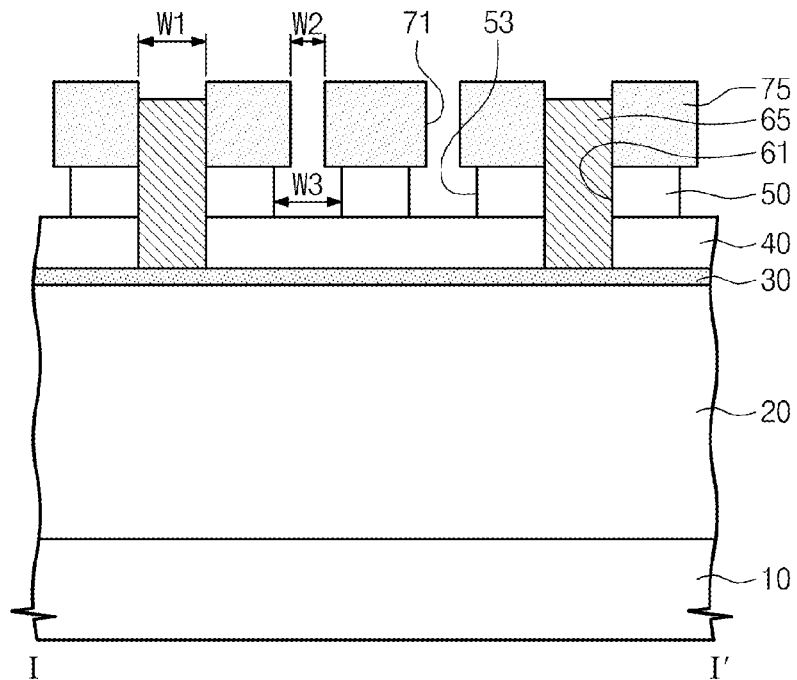
Figure 5C:
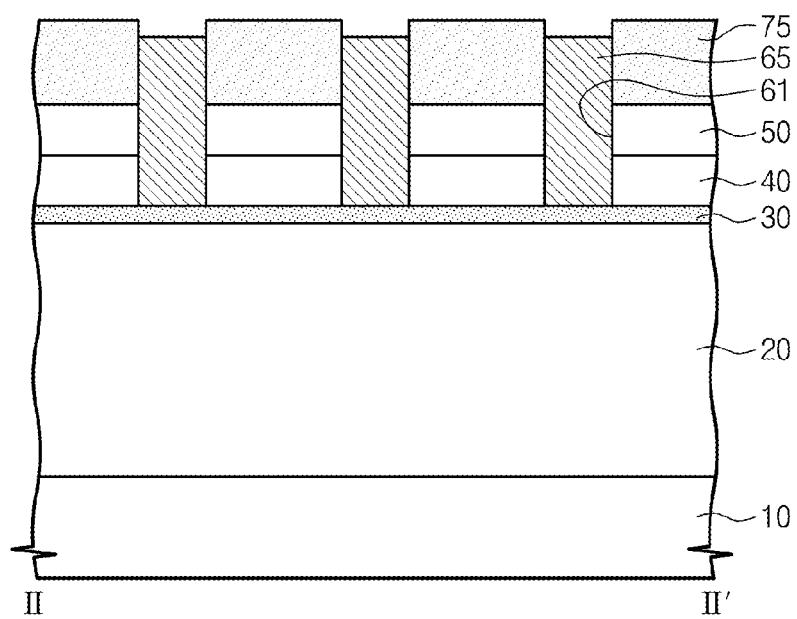

Referring to FIGS. 5A, 5B, and 5C, an isotropic etching process is performed on the buffer mask layer 50 in which the holes 51 are formed, thereby enlarging the widths of the holes 51 and forming enlarged holes 53. The enlarged holes 53 may expose portions of a bottom surface of the spacer pattern 75. Preferably, the width W3 of each of the enlarged hole 53 may be in the range of about 200% to about 500% of the width W2 of each of the holes 51.

The isotropic etching process is a wet etching process using an etchant solution having an etch selectivity with respect to the spacer pattern 75. Sidewalls of the buffer mask layer 50 exposed by the holes 52 are thus etched by the etchant solution. For example, if the buffer mask layer 50 is formed of a silicon oxide-based material, the wet etching process may be performed using a standard cleaning 1 (SC1) solution mixed with $NH_4OH/H_{-2}—O_2/H_2O$, a solution of diluted HF, or a buffer oxide etchant (BOE). Alternatively, if the buffer mask layer 50 is formed of a silicon nitride-based material, the wet etching process may be performed using an etchant solution including phosphoric acid.

The etchant solution is provided through the gaps 71 of the spacer pattern 75. Accordingly, the amount of etching solution applied to the buffer mask layer 50 is controlled and thus, the widths W3 of the enlarged holes 53 may be controlled. In this respect, the widths W3 of the enlarged holes 53 may be controlled regardless of the width W1 of the first openings 61 and the thickness t of the spacer layer 70. In the illustrated embodiment, the width W3 of each of the enlarged holes 53 is substantially equal to the width W1 of each of the first openings 61

Additionally, the buffer mask layer 50 and the sacrificial patterns 65 may be formed of the same material. In this case, the top surfaces of the sacrificial patterns 65 may become recessed in the spacer pattern 75 by the wet etching process for enlarging the holes 51 in the buffer mask layer 50.

Figure 6A:
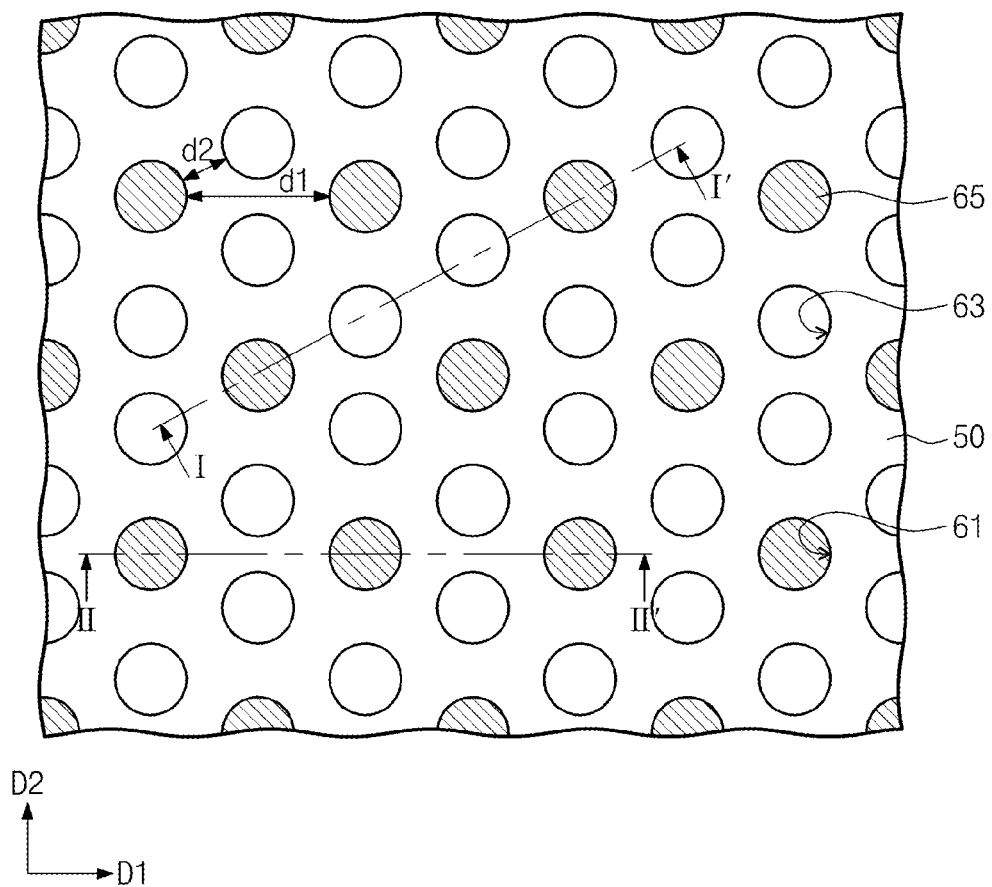
Figure 6B:
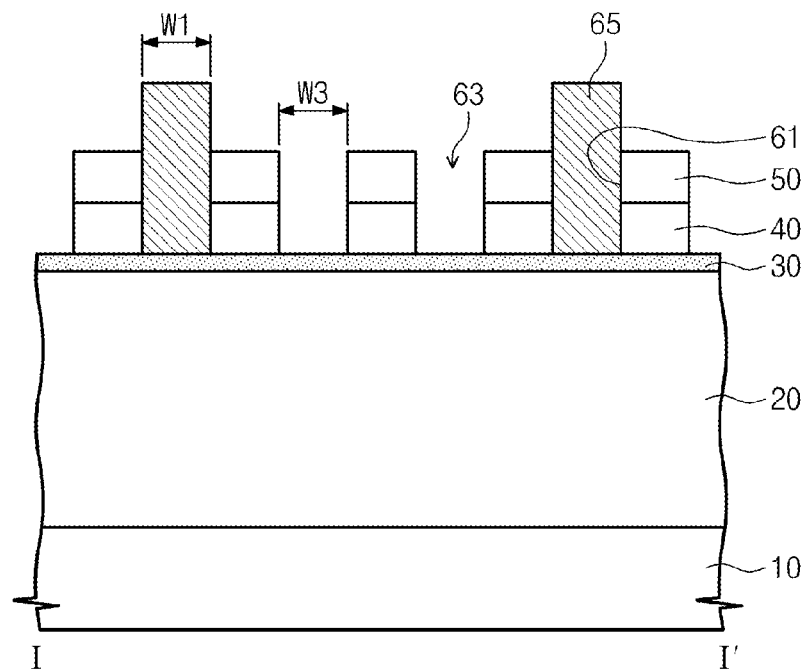
Figure 6C:
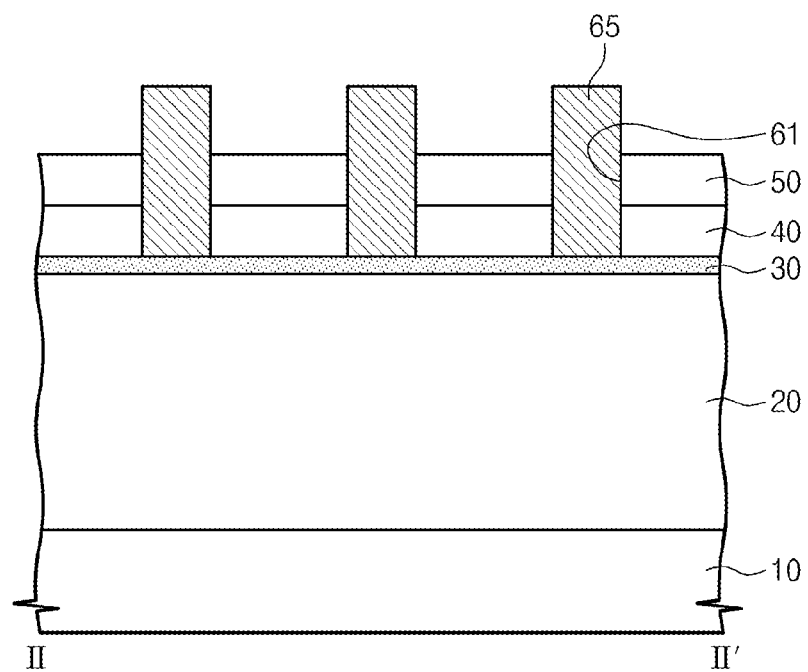

Referring to FIGS. 6A, 6B, and 6C, after the enlarged holes 53 are formed in the buffer mask layer 50, the spacer pattern 75 is removed. The spacer pattern 75 may be removed using an etchant that will not etch the sacrificial patterns 65 and the buffer mask layer 50.

Then, second openings 63 exposing the etch stop layer 30 are formed in the hard mask layer 40 by using the buffer mask layer 50 having the enlarged holes as an etch mask. In other words, portions of the hard mask layer 40 exposed by the enlarged holes are etched to form the second openings 63.

As a result, each of the first openings 61 is surrounded by a group of the second openings 63 (six second openings at the vertices of a hexagon in this example), and each of the second openings 63 may be disposed with a triangle whose vertices coincide with three adjacent ones of the first openings 61. In the illustrated embodiment, the width W3 of each of the second openings 63 is substantially equal to the width W1 of each of the first openings 61. Also, the distance d2 between the first opening 61 and the second opening 63 closest thereto is less than the smallest distance d1 between adjacent ones of the first openings 61. Additionally, the distance d2 between the first and second openings 61 and 63 closest to each other may be less than the width W1 of each of the first openings 61 and the width W3 of each of the second openings 63.

Figure 7A:
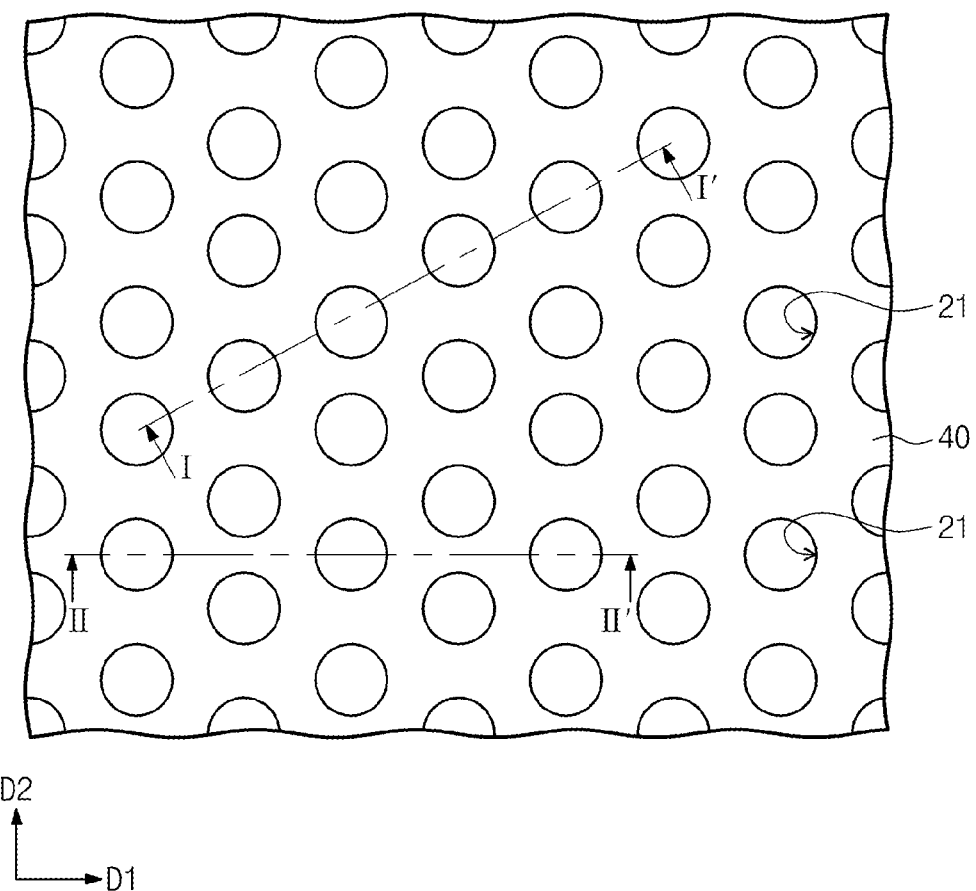
Figure 7B:
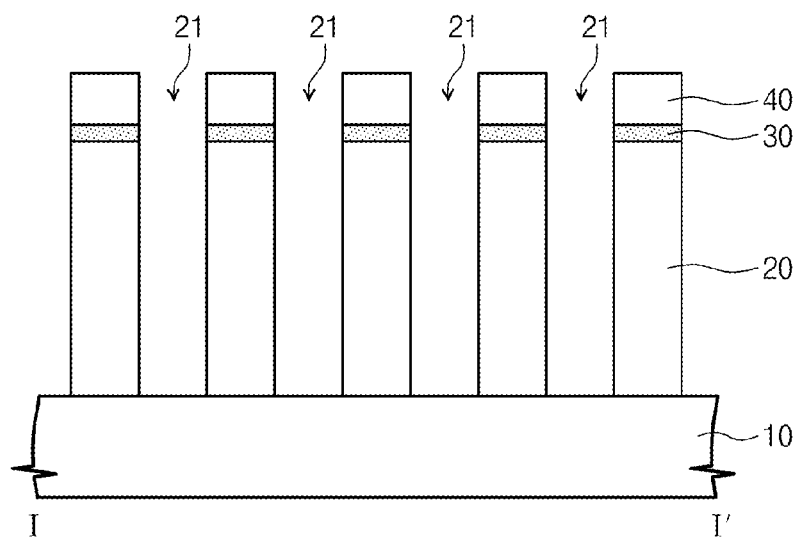
Figure 7C:
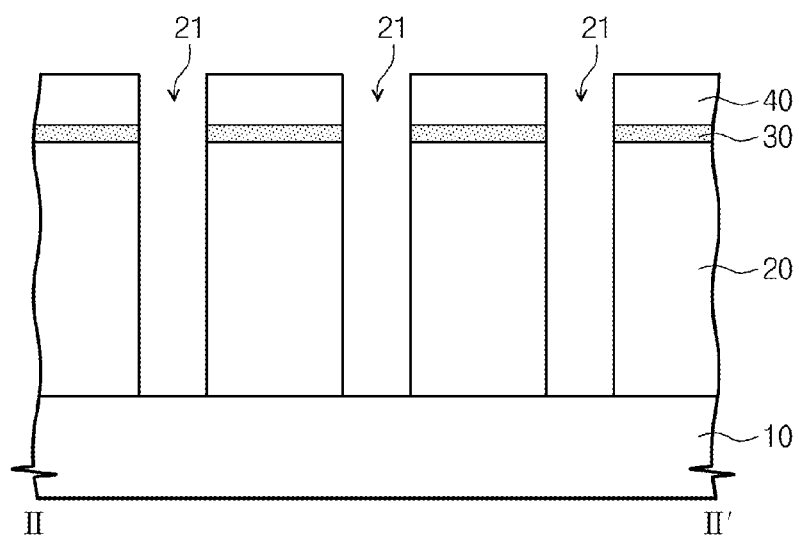

Referring to FIGS. 7A, 7B, and 7C, the buffer mask layer 50 and the sacrificial patterns 65 are removed. Thus, a top surface of the hard mask layer 40 having the first and second openings 61 and 63 may be exposed.

The lower layer 20 is anisotropically etched using the hard mask layer 40 having the first and second openings 61 and 63 as an etch mask. Thus, lower openings 21 are formed in the lower layer 20. In particular, the first and second openings 61 and 63 formed in the hard mask layer 40 are transferred to the lower layer 20, thereby forming the lower openings 21. Thus, like the first openings 61, the lower openings 21 have a zigzag or honeycomb pattern in the lower layer 20. In the illustrated embodiment, the lower openings 21 formed in the lower layer 20 expose the substrate 10. Furthermore, the smallest distance between adjacent ones of the lower openings 21 may be less than the width of each of the lower openings 21.

In any case, according to an aspect of the inventive concept, this smallest distance between the lower openings 21, i.e., the minimum pitch of the pattern of the lower openings 21, is less than that which could be achieved purely by a photolithography process due to inherent limits on the resolution of photolithography.

Hereinafter, another embodiment of a method of forming fine patterns according to the inventive concepts will be described with reference to FIGS. 8A to 11A and 8B to 11B in detail.

Figure 8A:
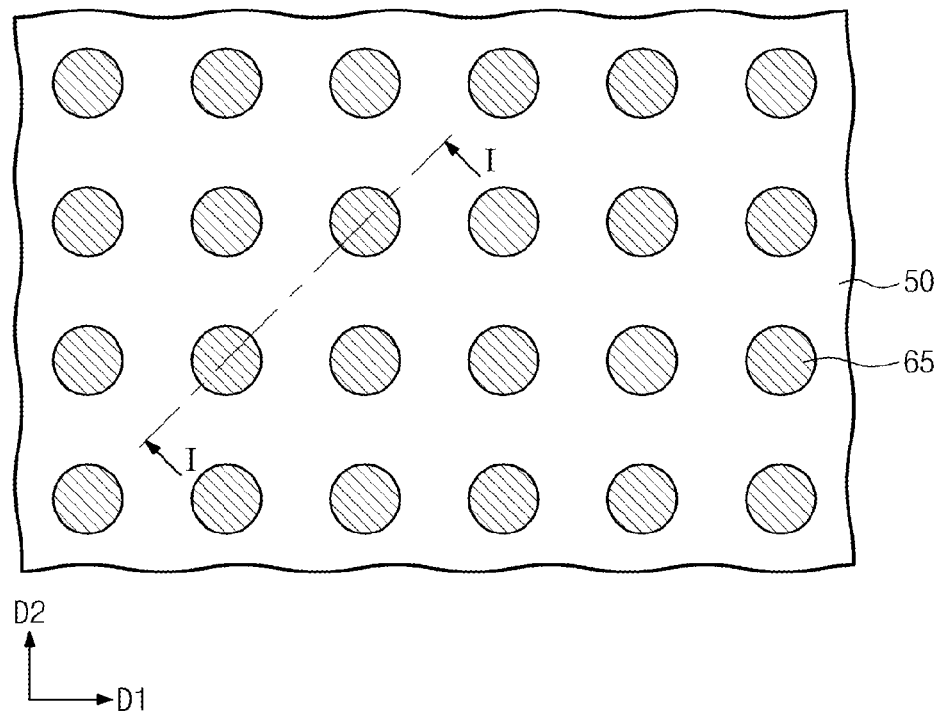
FIGS. 8A to 11B illustrate steps in another embodiment of a method of forming fine patterns according to the inventive concept, with FIGS. 8A, 9A, 10A and 11A each being a plan view of device structure during the course of the method, and FIGS. 8B, 9B, 10B and 11B being cross-sectional views taken along lines I-I' of FIGS. 8A, 9A, 10A and 11A, respectively.
Figure 8B:
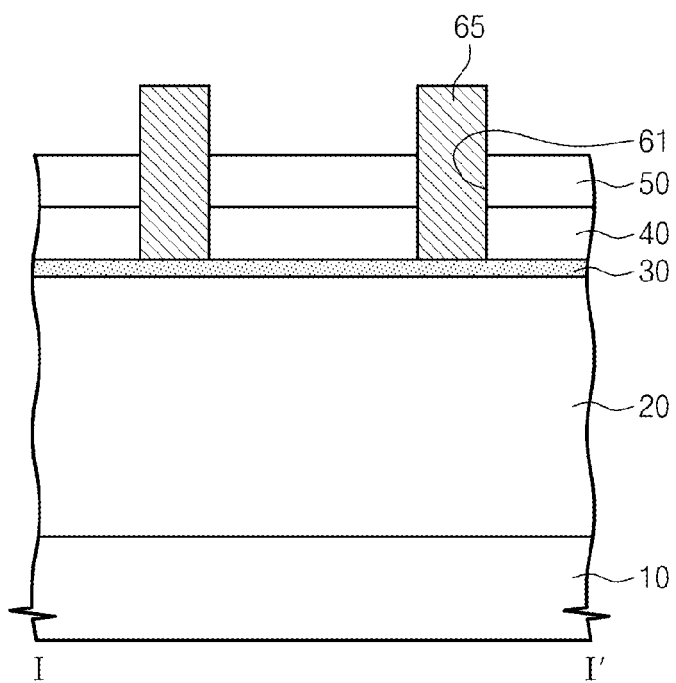

Referring to FIGS. 8A and 8B, first openings 61 are formed in the hard mask layer 40 and the buffer mask layer 50 stacked on the lower layer 20, in a manner similar to that described with reference to FIGS. 1A, 1B, and 1C. However, in the present embodiment, the first openings 61 are arranged in rows and columns extending in first and second directions D1 and D2 perpendicular to each other, with an opening 61 in each row and column aligned in directions D1 and D2 with a respective opening 61 in each of the other rows and columns. Moreover, the distance between adjacent first openings 61 (or pitch) in the first direction D1 may be substantially equal to the distance between adjacent first openings 61 (or pitch) in the second direction D2.

Subsequently, sacrificial patterns 65 are formed to fill the first openings 61 and protrude upward from the top surface of the buffer mask layer 50, as described with reference to FIGS. 2A, 2B, and 2C.

Figure 9A:
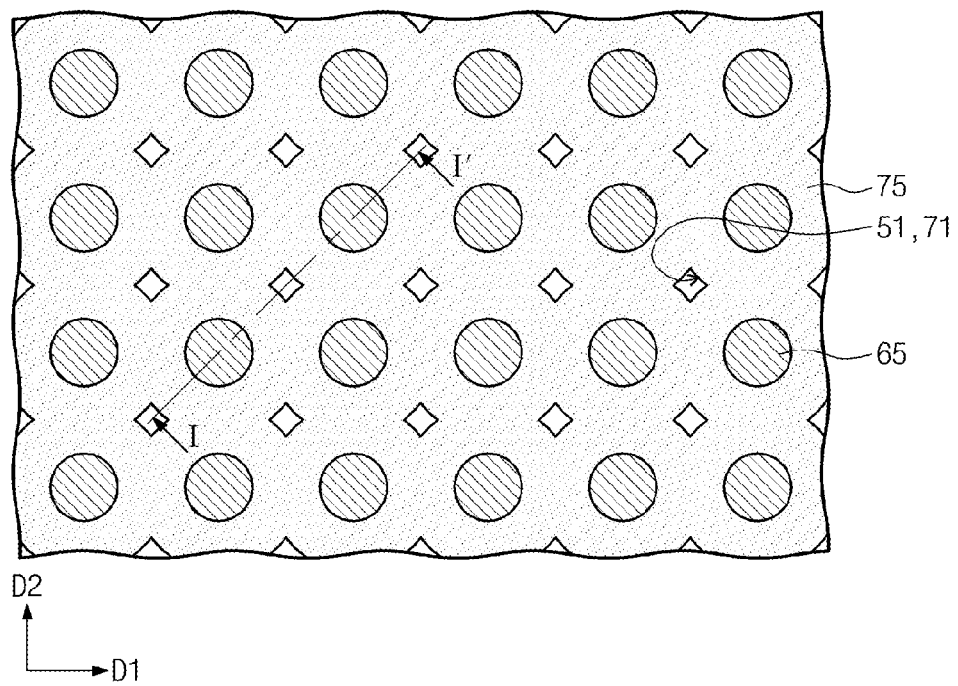
Figure 9B:
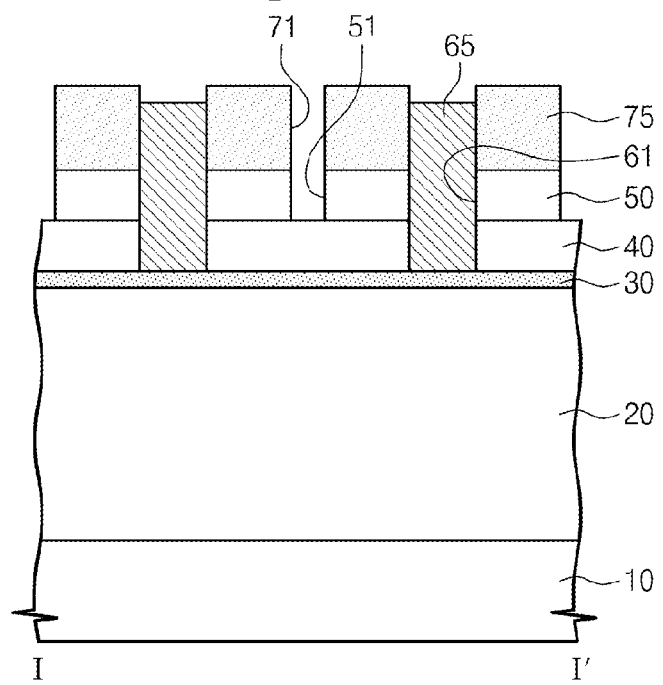

Referring to FIGS. 9A and 9B, a spacer pattern 75 is formed to such a thickness as to fill the spaces between adjacent sacrificial patterns 65 to each other in the rows and columns but to leave gaps 71, each between a respective group of four adjacent sacrificial patterns 65 coincident with the corners of a rectangle, respectively (or of a square in the case of the illustrated embodiment in which the pitch of the openings 61 in the first direction D1 is the same as the pitch of the openings D2 in the second direction). Forming the spacer pattern 75 may include forming a spacer layer (see 70 of FIG. 3B) conformally covering the sacrificial patterns 65 on the buffer mask layer 50, and anisotropically etching the spacer layer until top surfaces of the sacrificial patterns 65 are exposed, as described with reference to FIGS. 3A, 3B, and 3C. The spacer layer (see 70 of FIG. 3B) will have recesses each disposed between a respective group of four adjacent sacrificial patterns 65 coincident with the corners of a rectangle, respectively. Thus, after the spacer layer is anisotropically etched, the gaps 71 are formed, as described with reference to FIGS. 4A, 4B, and 4C.

Subsequently, the buffer mask layer 50 exposed by the gaps 71 of the spacer pattern 75 is anisotropically etched to form holes 51 in the buffer mask layer 50. Thus, the width of each of the holes 51 may be substantially equal to the width of each the gaps 71 of the spacer pattern 75.

Figure 10A:
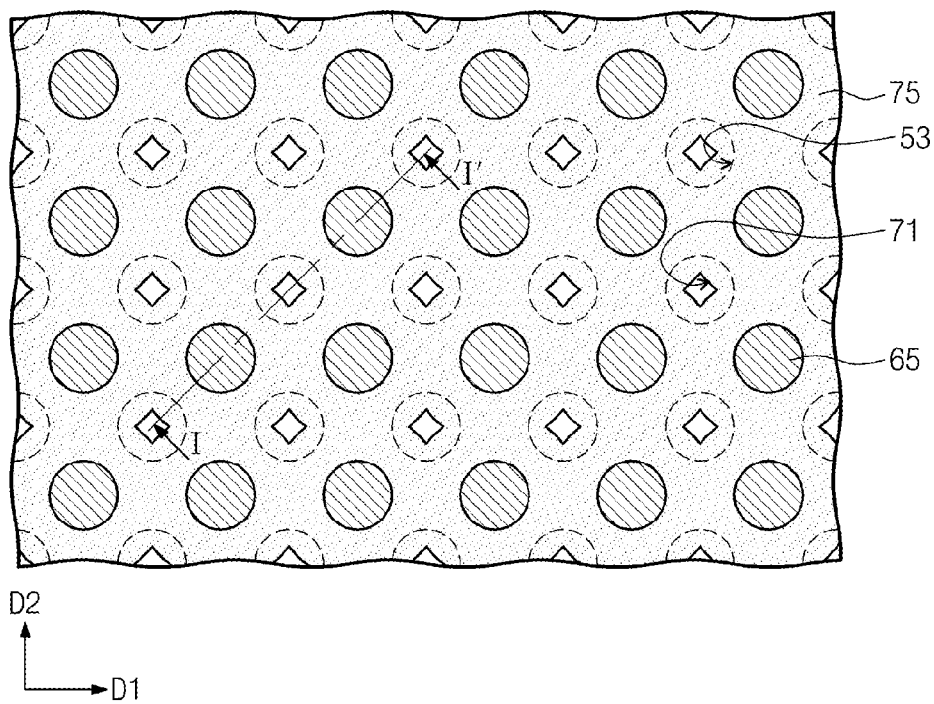
Figure 10B:
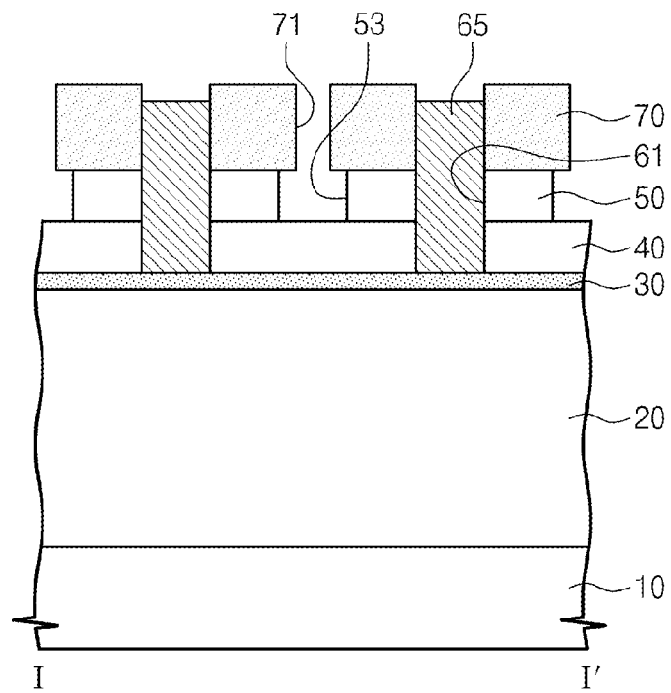

Referring to FIGS. 10A and 10B, the buffer mask layer 50 exposed by the holes is isotropically etched to enlarge the widths of the holes, as described with reference to FIGS. 5A, 5B, and 5C. Here, the amount that the buffer mask layer 50 is etched may be controlled to control the widths of the enlarged holes 53. Forming the enlarged holes 53 includes wet-etching portions of the buffer mask layer 50, as described with reference to FIG. 5B.

Figure 11A:
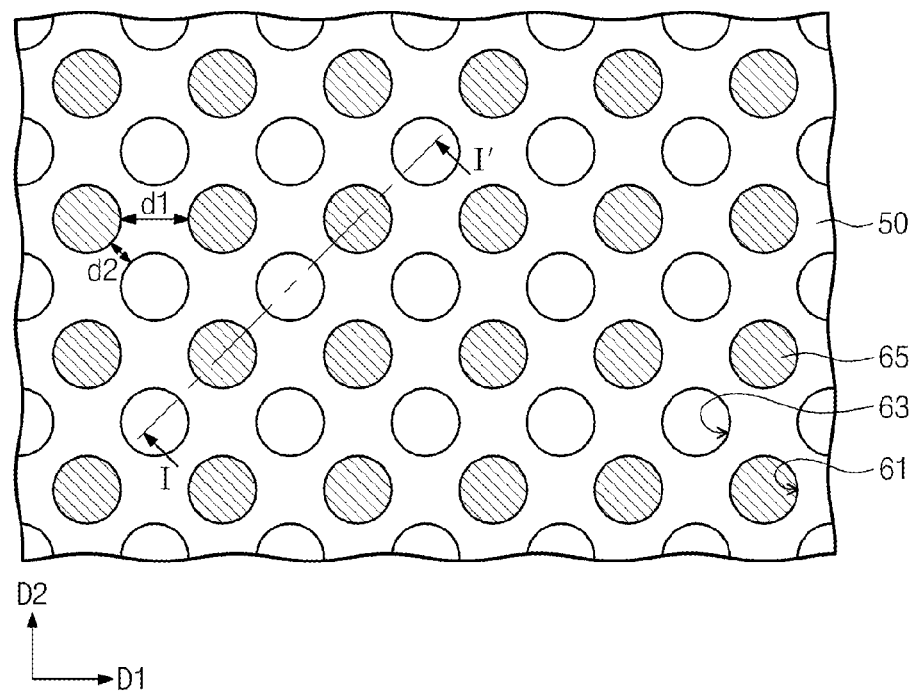
Figure 11B:
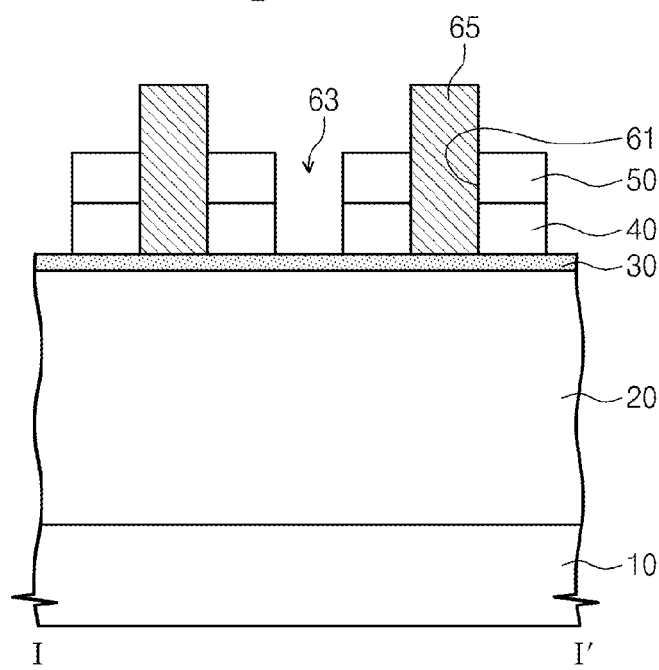

Subsequently, and referring to FIGS. 11A and 11B, the hard mask layer 40 exposed by the enlarged holes is anisotropically etched to form second openings 63. In the present embodiment, each of the second openings 63 is formed between at the center of a rectangle (e.g., a square) whose corners are coincident with four first openings 61 adjacent to each other. The distance d2 between the first opening 61 and the second opening 63 closest thereto may be less than the distance d1 between adjacent ones of the first openings 61 in the first or second direction D1 or D2. Additionally, the distance d2 may be less than the width of each of the first openings 61.

Subsequently, the lower layer 20 is anisotropically etched using the hard mask layer 40 having the first and second openings 61 and 63 as an etch mask, as described with reference to FIGS. 7A, 7B, and 7C.

Figure 12A:
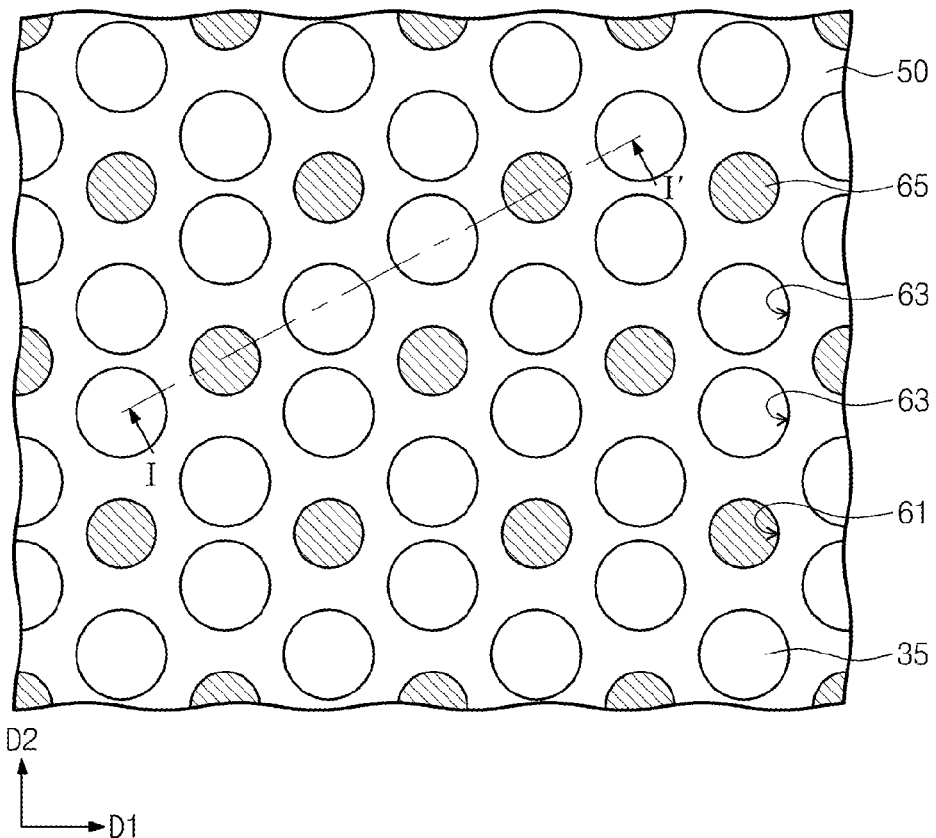
FIGS. 12A and 12B illustrate steps in still another embodiment of a method of forming fine patterns according to the inventive concept, with FIG. 12A being a plan view of device structure during the course of the method and FIG. 12B being a cross-sectional view taken along line I-I' of FIG. 12A.
Figure 12B:
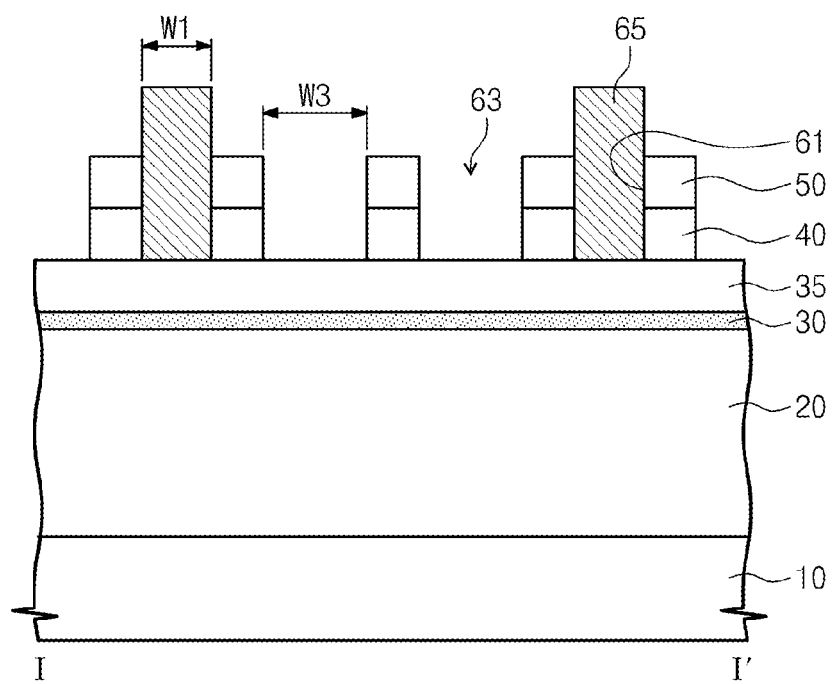

Another embodiment of a method of forming fine patterns according to the inventive concepts will be described hereinafter with reference to FIGS. 12A and 12B.

In this embodiment, a buffer layer 35 is formed on the lower layer 20 so as to be interposed between the lower layer 20 and the hard mask layer 40. The buffer layer 35 may be formed of a material having an etch selectivity with respect to the lower layer 20 and the hard mask layer 40. According to this embodiment, when an isotropic etching process is performed on the buffer mask layer 50 to form enlarged holes, the width of each of the enlarged holes becomes greater than the width W1 of each of the first openings 61. Thus, second openings 63 each having a width W3 greater than the width W1 of each of the first opening 61 are formed around each of the first openings 61.

Subsequently, the sacrificial patterns 65 are removed, and then the buffer layer 35, the etch stop layer 30, and the lower layer 20 are sequentially anisotropic ally etched using the hard mask layer 40 having the first and second openings 61 and 63 as an etch mask, thereby forming lower openings in the lower layer 20. In this case, each of the lower openings extending from the first openings 61 have a width different from that of each the lower openings extending from the second openings 63.

Figure 13A:
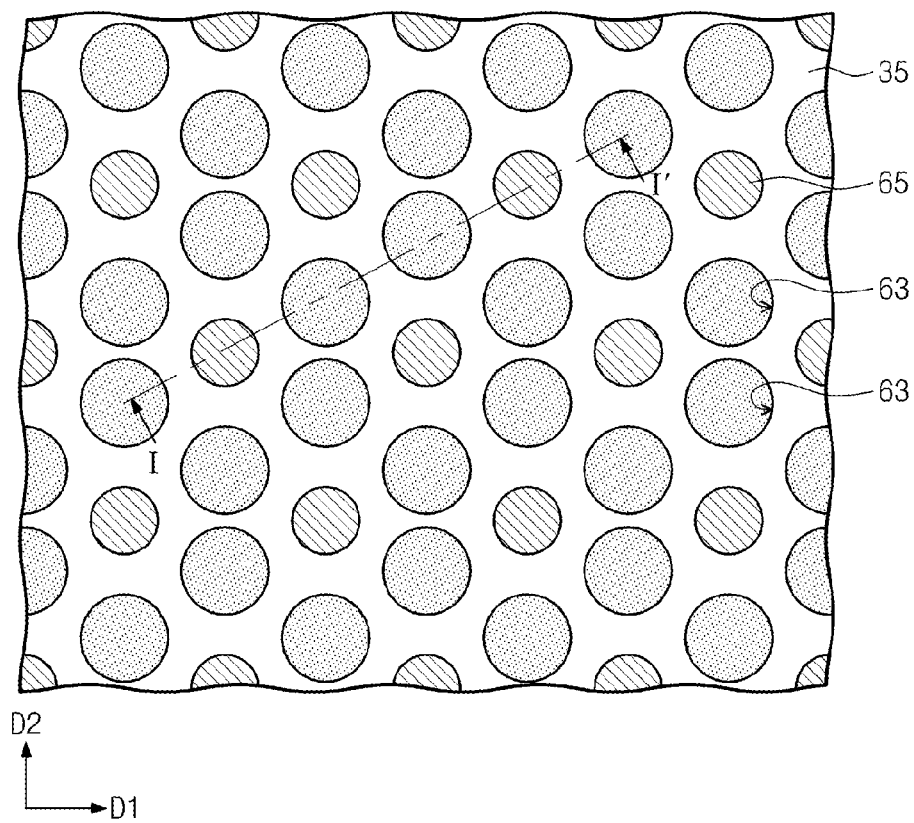
FIGS. 13A and 13B illustrate steps in still another embodiment of a method of forming fine patterns according to the inventive concept, with FIG. 13A being a plan view of device structure during the course of the method and FIG. 13B being a cross-sectional view taken along line I-I' of FIG. 13A.
Figure 13B:
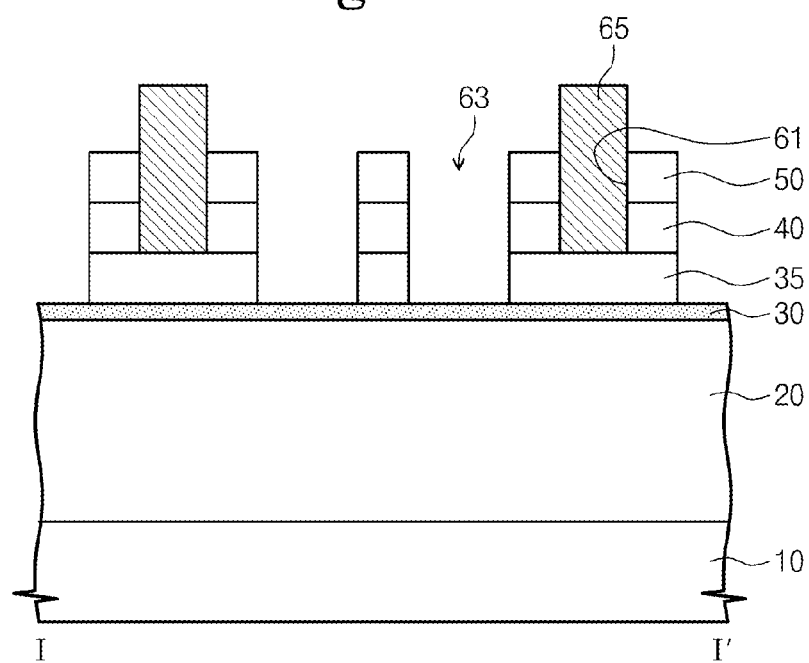

Another embodiment of a method of forming fine patterns according to the inventive concepts will be described hereinafter with reference to FIGS. 13A and 13B.

In this embodiment, a buffer layer 35 is formed on the lower layer 20 so as to be interposed between the lower layer 20 and the hard mask layer 40. The buffer layer 35 may be formed of a material having an etch selectivity with respect to the lower layer 20 and the hard mask layer 40. According to this embodiment, after the second openings 63 are formed in the hard mask layer 40, the sacrificial patterns 65 are left in the first openings 61 while the buffer layer 35 exposed by the second openings 63 is anisotropically etched to transfer the second openings 63 to the buffer layer 35. Thus, openings having the pattern of a honeycomb or a pattern of zigzags are formed in the buffer layer 35. In this case, the shortest distance between the adjacent openings formed in the buffer layer 35 is less than the shortest distance between adjacent ones the first openings 61, i.e., the distance between closest ones of the openings 63 in the buffer layer 35 is less than the distance between closest ones of the first openings 61.

A method of manufacturing a semiconductor device using a method of forming fine patterns according the inventive concepts will be described in detail hereinafter with reference to FIGS. 14-20. The semiconductor device may be or constitute a highly integrated semiconductor memory device (e.g., a dynamic random access memory (DRAM) device, a static RAM (SRAM) device, a phase change RAM (PRAM) device, a resistance RAM (RRAM) device, a magnetic RAM (MRAM) device, a ferroelectric RAM (FRAM) device, and/or a flash memory device), a micro electro mechanical system (MEMS) device, an optoelectronic device, or a processor (e.g., a central process unit (CPU) or a digital signal processor (DSP)). In some cases, several of the same kind of semiconductor device may be made according to the inventive concept and combined together in the final product. Alternatively, different kinds of semiconductor devices required may be each made according to the inventive concept and then combined to provide one complete function as in the case of a single chip data processing device such as a system-on-chip (SoC).

Figure 14:
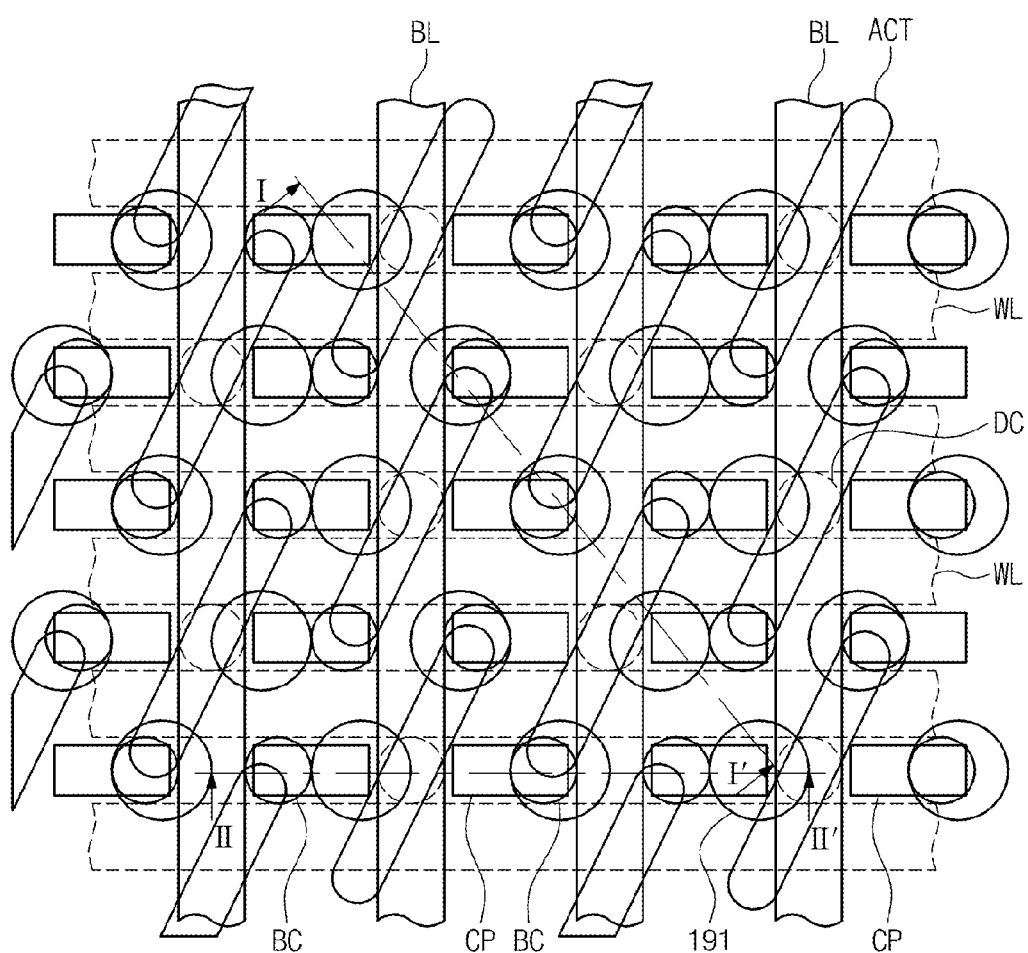
FIG. 14 is a plan view of a semiconductor memory device formed using a method of forming fine patterns according the inventive concept.
Figure 15:
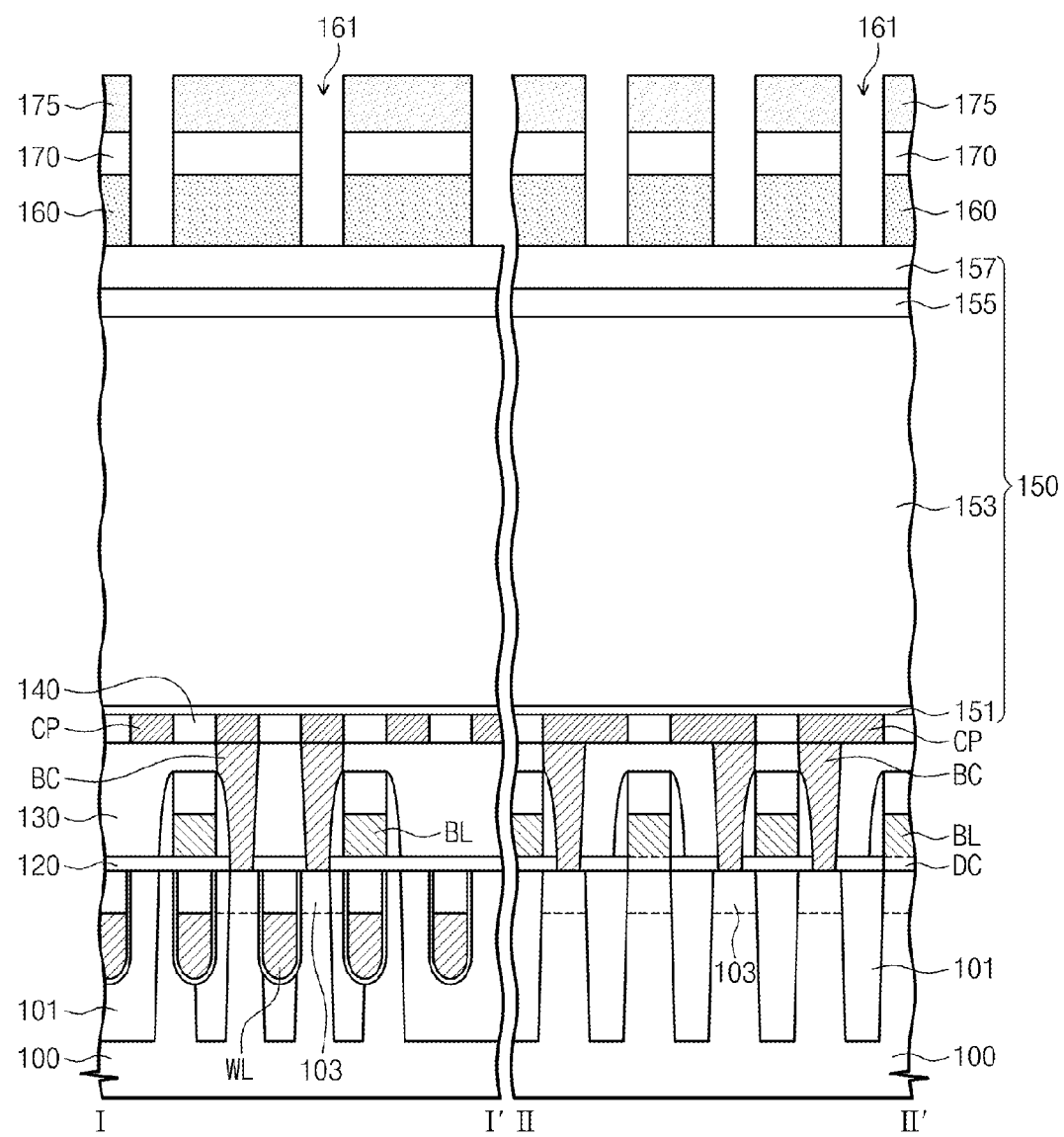
FIGS. 15 to 20 illustrate a method of manufacturing a semiconductor memory device of FIG. 14, with each of FIGS. 15, 16, 17, 18, 19 and 20 including cross-sectional views taken in the direction of lines I-I' and II-IF of FIG. 14 during the course of manufacturing the device of FIG. 14.

Referring to FIGS. 14 and 15, a semiconductor memory device includes word lines WL, bit lines BL perpendicular to the word lines WL, and memory cells respectively disposed at crossing points of the word lines WL and bit lines BL.

In more detail, a device isolation layer 101 that defines active regions ACT is formed in or on (i.e., at the top of) a semiconductor substrate 100. Here, the active regions ACT may have bar shapes, and longitudinal axes of the active regions ACT may extend in a diagonal direction with respect to those of the word lines WL and the bit lines BL.

The word lines WL may be disposed to cross the active regions ACT. In an example of this, each of the word lines WL are formed in recesses in the top surface of the semiconductor substrate 100. A gate insulating layer may be disposed between the word line WL and an inner surface of the substrate 100 defining the recess. Additionally, top surfaces of the word lines WL may be disposed at a lower level than the top surface of the semiconductor substrate 100 and an insulating material may fill the top of the recess in which the word line WL is formed.

Source and drain regions 103 are formed in the active regions ACT at both sides of each of the word lines WL. The source and drain regions 103 may be doped regions of the substrate 100.

Thus, the word lines WL and the source and drain regions 103 constitute a plurality of MOS transistors at the top of the semiconductor substrate 100.

The bit lines BL cross over the word lines WL on the semiconductor substrate 100. A first interlayer insulating layer 120 may be disposed between the semiconductor substrate 100 and the bit lines BL, and bit line-contact plugs DC may be formed in the interlayer insulating layer 120 to electrically connect some of the source and drain regions 103 to the bit lines BL.

Contact plugs BC may be formed in a second interlayer insulating layer 130 covering the bit lines BL to electrically connect the others of the source and drain regions 103 to data storage elements, respectively. In an example of this embodiment, such contact plugs BC are disposed on the active region ACT at both sides of each of the bit lines BL.

Contact holes exposing the others of the source and drain regions 103 may be formed in the second and first interlayer insulating layers 130 and 120, conductive material may be deposited to form a conductive layer filling the contact holes, and then the conductive layer may be planarized to form the contact plugs BC. The contact plugs BC may be formed of at least one of a doped poly-silicon layer, a metal layer, a metal nitride layer, a metal silicide, or a combination thereof.

In an example of this embodiment, contact pads CP are formed on the contact plugs BC, respectively. The contact pads CP may be two-dimensionally arranged on the second interlayer insulating layer 130. Furthermore, two adjacent contact pads respectively disposed on opposite sides of the bit line BL may extend in opposite directions, respectively. The contact pads CP serve to increase areas of contact between the contact plugs BC and lower electrodes formed on the contact pads CP.

Subsequently, a mold layer 150 may be formed on a third interlayer insulating layer 140 in which the contact pads CP are formed. The thickness to which the mold layer 150 is formed depends on the desired height of a lower electrode of a cylindrical capacitor to be formed.

In an example of this embodiment, the mold layer 150 includes an etch stop layer 151, a lower mold layer 153, a support layer 155, and an upper mold layer 157 that are sequentially stacked. The lower and upper mold layers 153 and 157 may be formed of silicon oxide. The etch stop layer 151 and the support layer 155 may be formed of a material having an etch selectivity with respect to the lower and upper mold layers 153 and 157 in a process of wet-etching the lower and upper mold layers 153 and 157. For example, the etch stop layer 151 and the support layer 155 may be formed of silicon nitride.

Referring again to FIG. 15, a hard mask layer 160 and a buffer mask layer 170 are sequentially stacked on the mold layer 150. The hard mask layer 160 may be formed of a material having an etch selectivity with respect to the buffer mask layer 170. Next, first openings 161 are formed using a mask pattern 175 disposed on the buffer mask layer 170 in the hard mask layer 160 and the buffer mask layer 170, as described with reference to FIGS. 1A, 1B, and 1C. The first openings 161 may be formed in the zigzag or honeycomb pattern shown in and described with reference to FIG. 1A. Alternatively, the first openings 161 may be formed in a regular matrix (two dimensional array) as described with reference to FIG. 8A.

Figure 16:
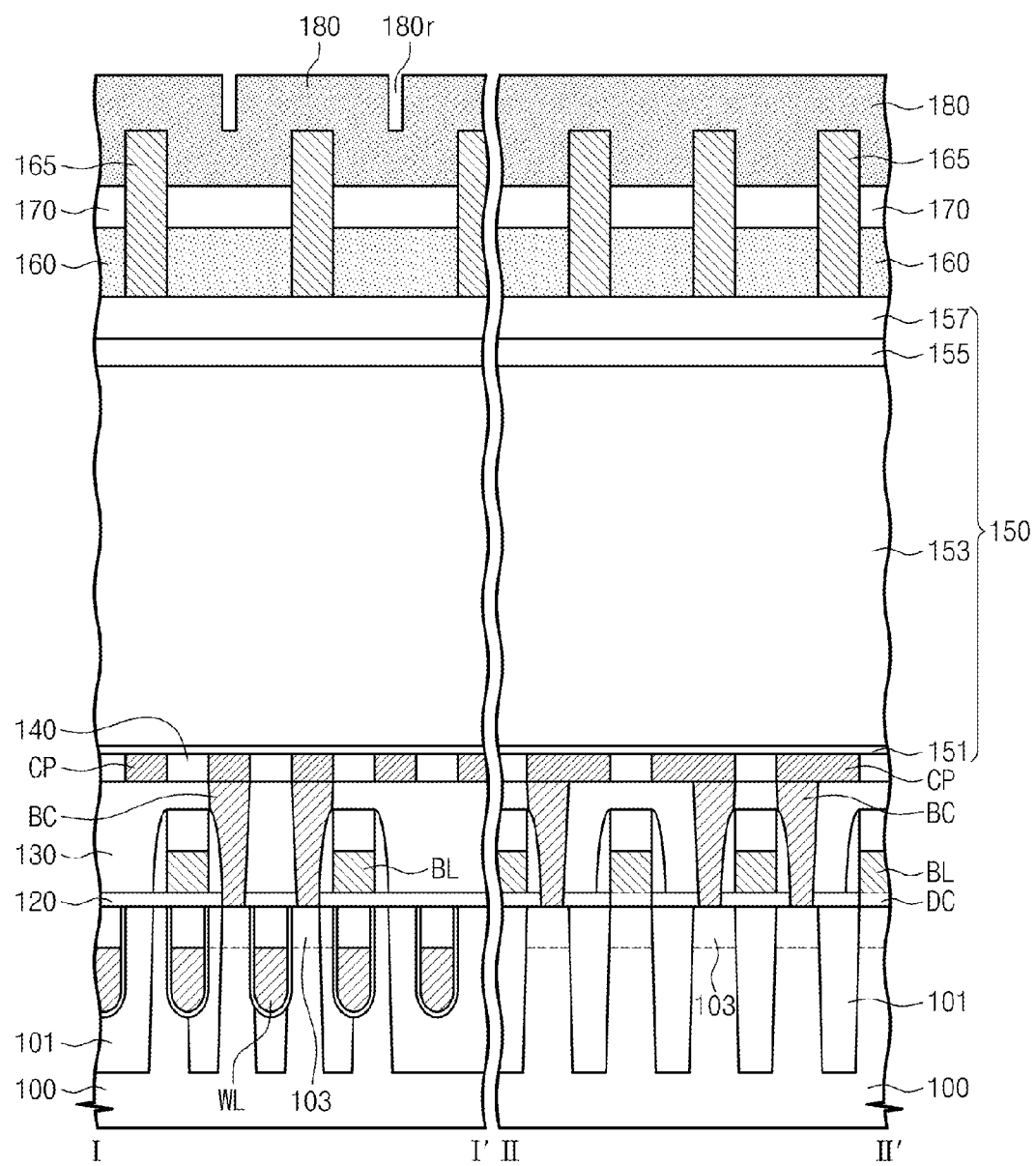

Referring to FIG. 16, after sacrificial patterns are formed to fill the first openings 161, the mask pattern 175 is removed. In this case, the sacrificial patterns 165 thus protrude upward from a top surface of the buffer mask layer 170.

A spacer layer 180 conformally covering the sacrificial patterns 165 is formed on the buffer mask layer 170. The spacer layer 180 may be formed to a thickness greater than half the distance between two adjacent sacrificial patterns 165. Thus, the spacer layer 180 fills the spaces between sacrificial patterns 165 adjacent to each other in rows and columns perpendicular to each other, but leaves recesses 180r each of which is disposed within a triangle whose vertices are coincident with three sacrificial patterns 165 adjacent to each other (or at the center of a rectangle or square whose corners are coincident with four sacrificial patterns 165 adjacent to each other as in the embodiment described above with reference to FIGS. 8A to 11B).

Figure 17:
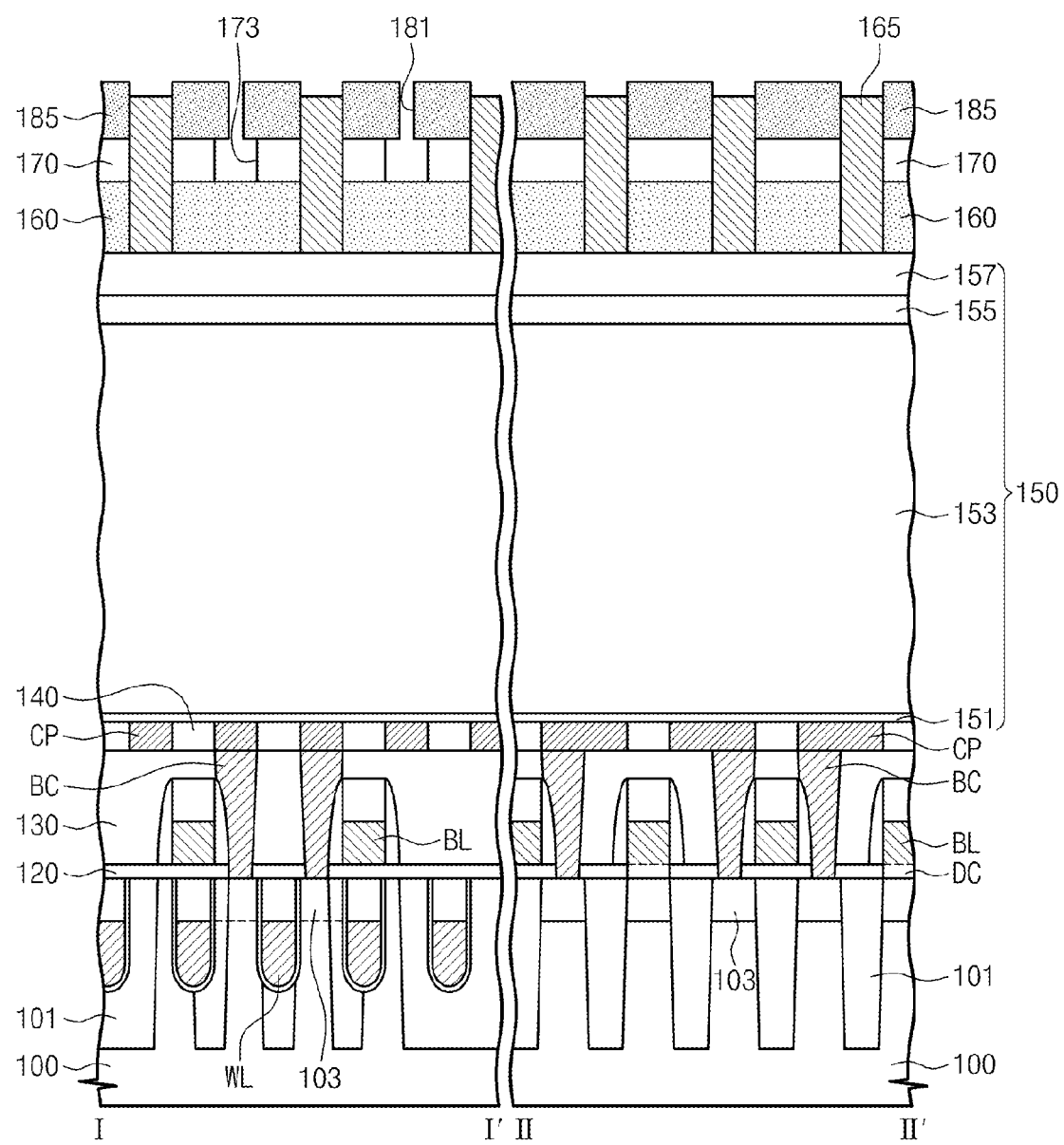

Subsequently, referring to FIGS. 14 and 17, the spacer layer 180 is anisotropically etched to form a spacer pattern 185. The spacer pattern 185 fills the spaces between adjacent sacrificial patterns 165 and leaves gaps 181 each of which locally exposes the buffer mask layer 170 between three sacrificial patterns 165 adjacent to each other and located at the vertices of a triangle. As described above, an anisotropic etching process and an isotropic etching process are sequentially performed using the spacer pattern 185 as an etch mask. Thus, enlarged holes 173 each having a width greater than the width of each of the gaps 181 of the spacer pattern 185 are formed in the buffer mask layer 170.

Figure 18:
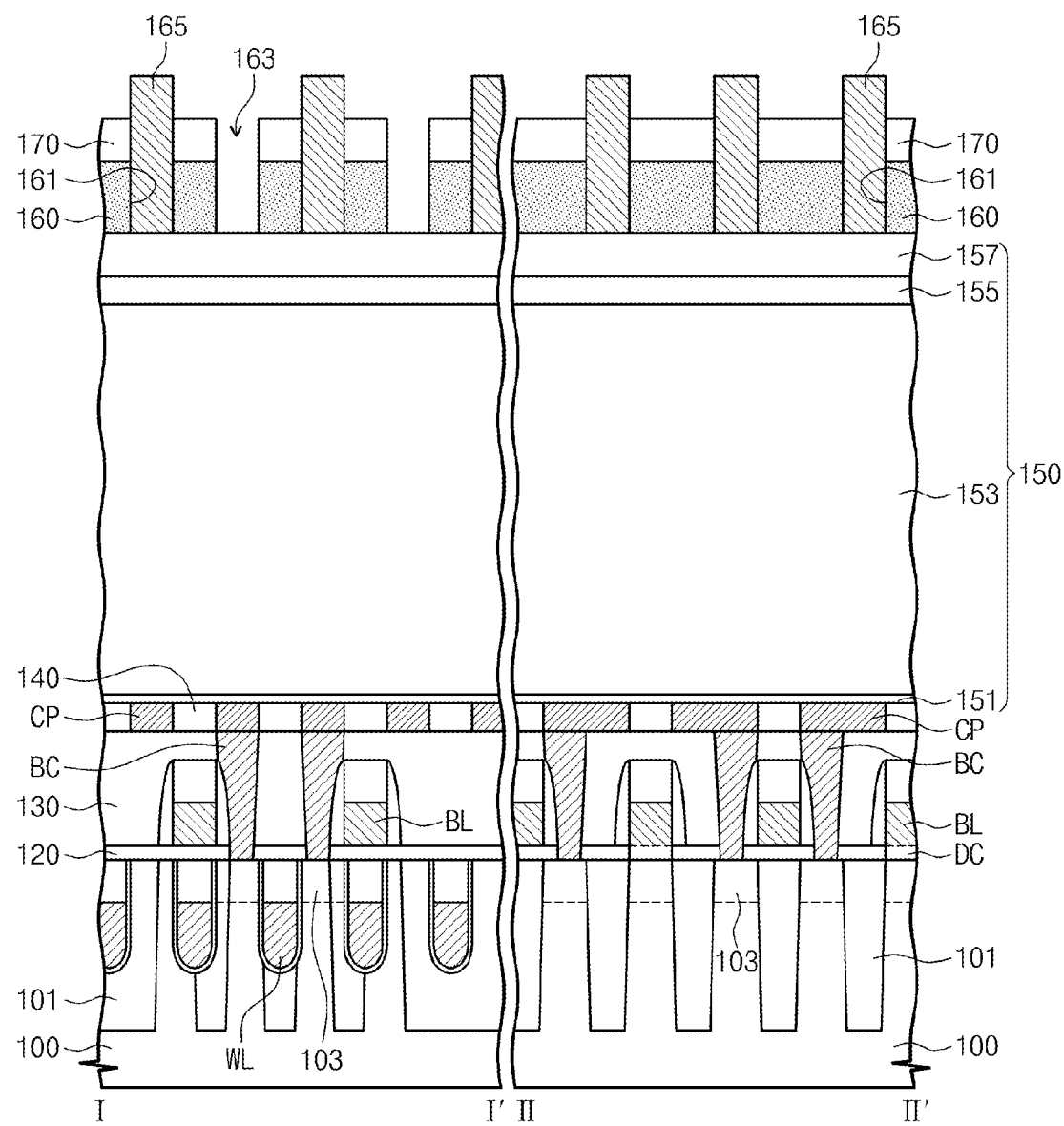

Referring to FIG. 18, after the spacer pattern 175 is removed, second openings 163 are formed in the hard mask layer 160 by using the buffer mask layer 170 having the enlarged holes 173 as an etch mask. Thus, the hard mask layer 160 having the first and second openings 161 and 163 is formed. The first and second openings 61 and 63 are disposed at locations corresponding to the contact pads CP, respectively. Additionally, the distance between the first and second openings 161 and 163 is less than the distance between the first openings 161, as described above.

Figure 19:
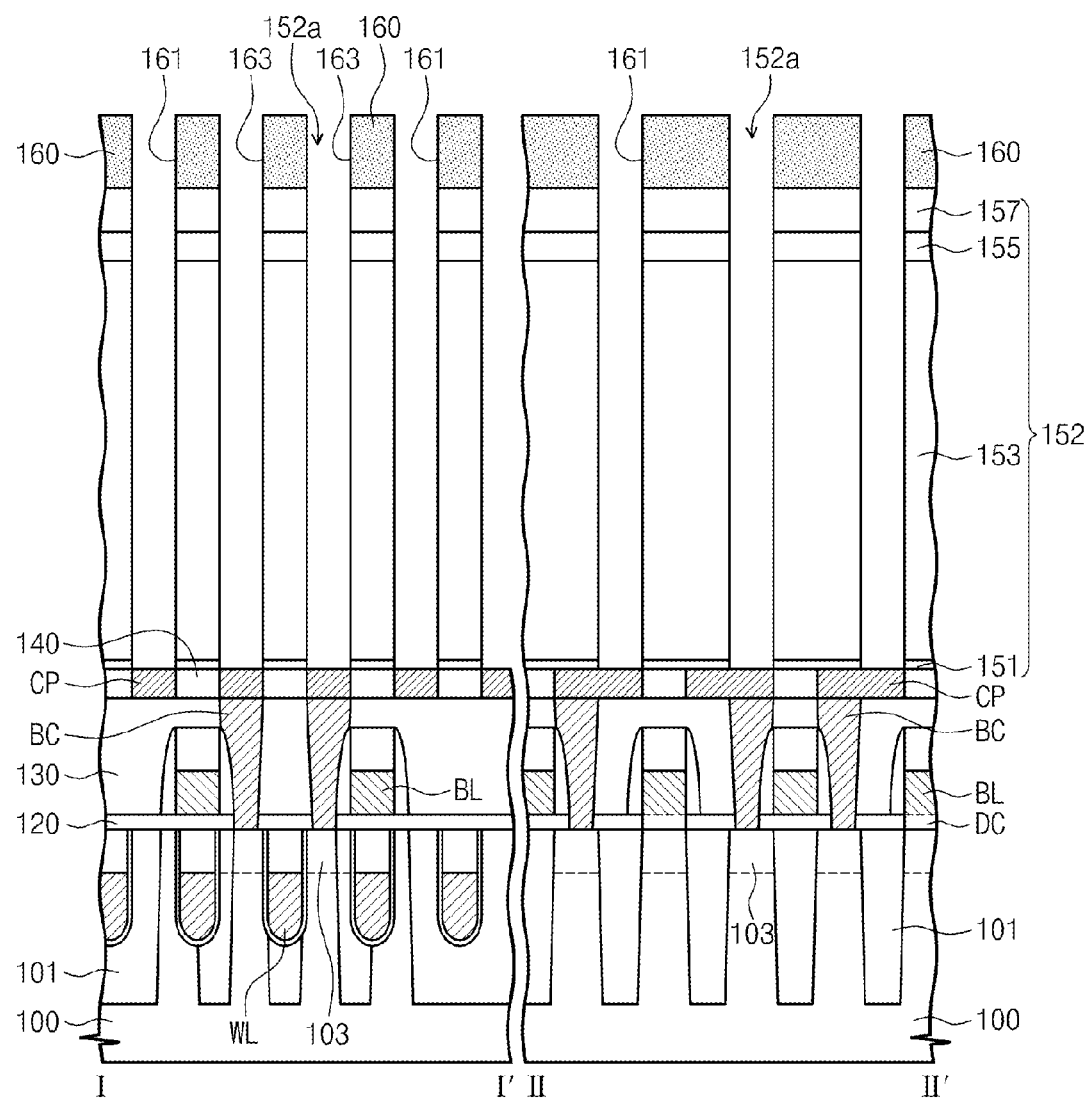

Referring to FIG. 19, after the buffer mask layer 160 is removed, the mold layer 150 is anisotropically etched using the hard mask layer 160 as an etch mask. Thus, a mold pattern 152 having lower holes 152a is formed. The lower holes 152a expose the contact pads CP, respectively. The lower holes 152a may be arranged in a zigzag pattern.

Figure 20:
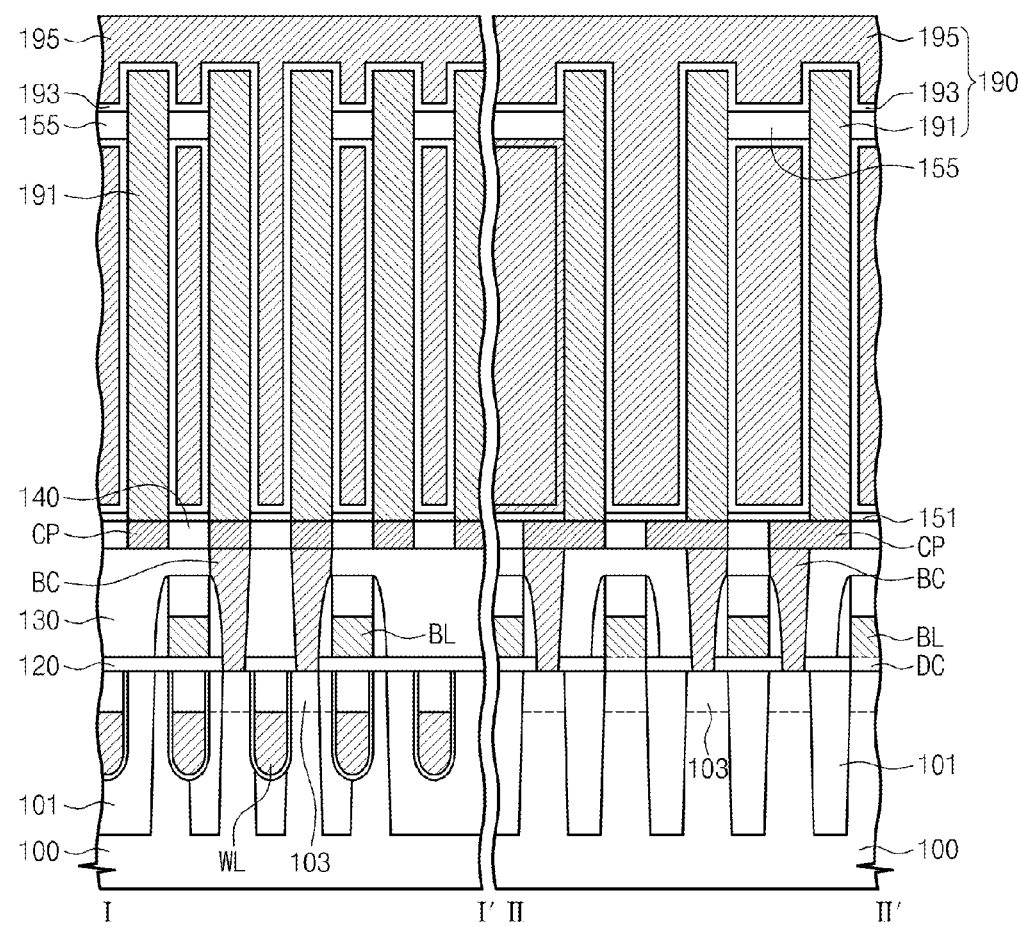

Next, referring to FIGS. 14 and 20, lower electrodes 191 are formed in the lower holes 152a. To this end, conductive material may be conformally deposited on the structure including along the sides of the lower holes 152a and then the conductive material deposited on a top surface of the mold pattern 152 may be removed to form the lower electrodes 191 having cylindrical shapes in the lower holes 152a, respectively. Thus, the lower electrodes 191 may be formed to be electrically connected to the contact pads CP. The lower electrodes 191 may be arranged in the zigzag pattern. After the lower electrodes 191 are formed, the lower and upper mold layers 153 and 155 are selectively removed to expose sidewalls of the lower electrodes 191. Subsequently, a dielectric layer 193 is formed to conformally cover the lower electrodes 191, and an upper electrode 195 is formed on the dielectric layer 193. Thus, in this embodiment, a capacitor 190 including the lower electrode 191 and the upper electrode 195, and the dielectric layer therebetween is formed.

FIG. 21 illustrates a three-dimensional (3D) semiconductor memory device formed using a method of forming fine patterns according to the inventive concepts.

Referring to FIG. 21, the three-dimensional (3D) semiconductor memory device of this example includes a common source line CSL, a plurality of bit lines BL and a plurality of cell strings CSTR disposed between the common source line CSL and the bit lines BL.

The common source line CSL may be a conductive thin layer disposed on a substrate 10 or a doped region of the substrate 10. The bit lines BL may be conductive patterns (e.g., metal lines) that are spaced apart from the substrate 10 and are disposed over the substrate 10. The bit lines BL may be two-dimensionally arranged and a plurality of the cell strings CSTR may be connected in parallel to each of the bit lines BL. Thus, the cell strings CSTR may be two-dimensionally arranged on the common source line CSL or the substrate 10.

Each of the cell strings CSTR may include a plurality of lower selection lines LSL1 and LSL2, a plurality of word lines WL1 to WL4 and a plurality of upper selection lines USL1 and USL2, which are disposed between the common source line CSL and the bit line BL. The lower selection lines LSL1 and LSL2, the word lines WL1 to WL4 and the upper selection lines USL1 and USL2 may be conductive patterns stacked on the substrate 10 with insulating layers therebetween.

Additionally, each of the cell strings CSTR may include a semiconductor pillar PL extending vertically from the substrate 10 and may be connected to a bit line BL. The semiconductor pillars PL extend through the upper selection lines USL1 and USL2, the word lines WL1 to WL4, and the lower selection lines LSL1 and LSL2. In other words, the semiconductor pillars PL extend through a plurality of conductive patterns stacked on the substrate 10. Additionally, each semiconductor pillar PL may include a body portion B and dopant regions formed at one end portion or both end portions of the body portion B. For example, a drain region D may be formed in a top end portion of the semiconductor pillar PL (i.e., between the body portion B and the bit line BL).

A data storage layer DS may be disposed between the word lines WL1 to WL4 and the semiconductor pillars PL. In one example of this embodiments, the data storage layer DS is a charge storage layer. For example, the data storage layer DS may be a trap insulating layer, a floating gate electrode, or an insulating layer including conductive nano dots.

A dielectric layer used as a gate insulating layer is interposed between each of the lower selection lines LSL1 and LSL2 and the semiconductor pillar PL and/or between each of the upper selection lines USL1 and USL2 and the semiconductor pillar PL. The dielectric layer may be formed of the same material as the data storage layer DS or may be a gate insulating layer (e.g., a silicon oxide layer) for a general metal-oxide-semiconductor field effect transistor (MOSFET).

In the structures described above, the semiconductor pillars PL, the lower selection lines LSL1 and LSL2, the word lines WL1 to WL4, and the upper selection lines USL1 and USL2 may constitute MOSFETs using the semiconductor pillars PL as channel regions. Alternatively, the semiconductor pillars PL, the lower selection lines LSL1 and LSL2, the word lines WL1 to WL4, and the upper selection lines USL1 and USL2 may constitute MOS capacitors. In other words, the cell string CSTR may include lower and upper selection transistors including the lower and upper selection transistors LSL1, LSL2, USL1, and USL2 and cell transistors including the word lines WL1 to WL4. The lower selection transistors, the cell transistors, and the upper selection transistors in the cell string CSTR may be connected in series to each other.

In the 3D semiconductor memory device described above, the semiconductor pillars PL are formed using a method of forming fine patterns according to the inventive concepts.

More specifically, a stack structure including insulating layers and conductive layers alternately and repeatedly stacked on a substrate 10 are provided to form the lower selection lines LSL1 and LSL2, the word lines WL1 to WL4, and the upper selection lines USL1 and USL2. The stack structure may correspond to any lower layer described with reference to FIGS. 1b to 13b. Holes H1 and H2 are formed in the stack structure using the hard mask layer having the first and second openings as an etch mask. The holes H1 and H2 may be arranged in a zigzag pattern. A minimum distance between the holes H1 and H2 is less than the width of each of the holes H1 and H2. Subsequently, the data storage layer DS and the semiconductor pillars PL are formed in the holes H1 and H2.

Figure 22:
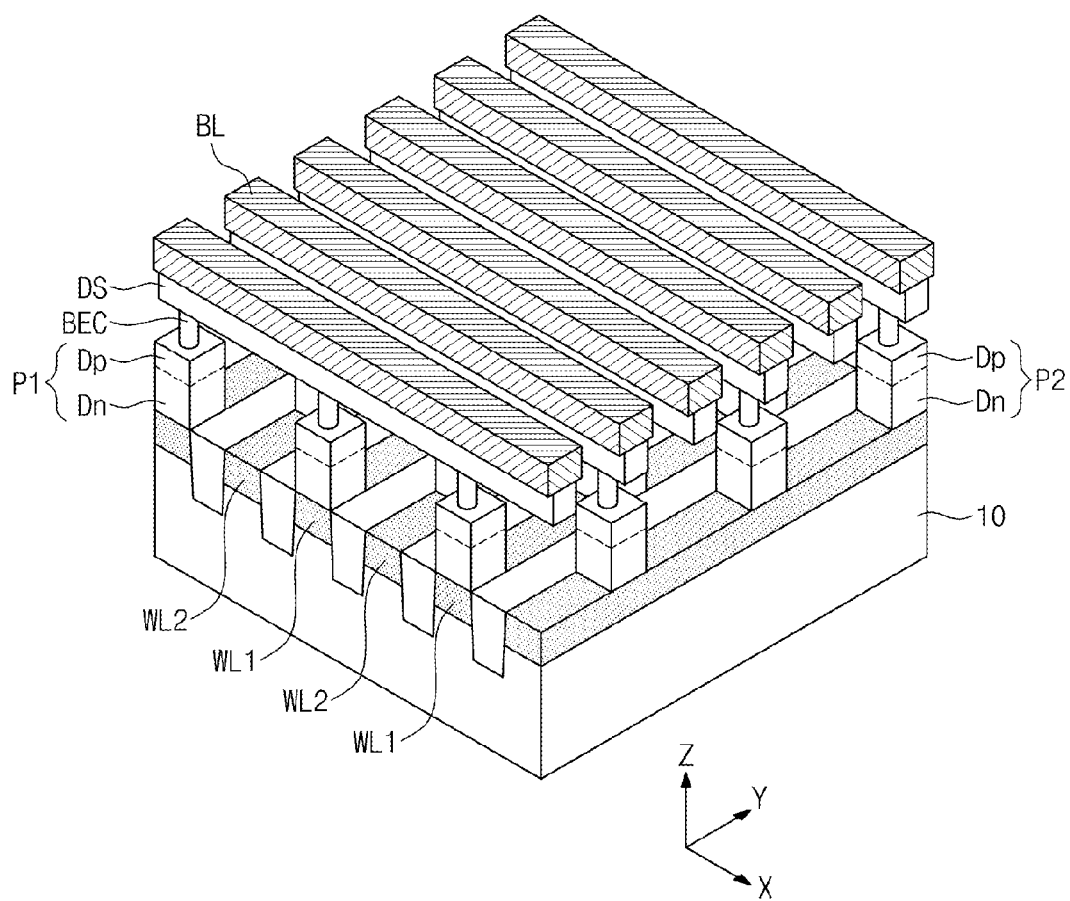
FIG. 22 is a cross-sectional view of a variable resistance memory device formed using a method of forming fine patterns according to the inventive concept.

FIG. 22 illustrates a variable resistance memory device formed using a method of forming fine patterns according to the inventive concepts.

Referring to FIG. 22, the variable resistance memory device includes a semiconductor substrate 10, lower interconnections WL1 and WL2 disposed on the semiconductor substrate 10, upper interconnections BL crossing over the lower interconnections WL1 and WL2, selection elements disposed at regions where the lower interconnections WL1 and WL2 cross the upper interconnections BL, and memory elements DS interposed between the selection elements and the upper interconnections BL. The selection elements may be two-dimensionally arranged on the semiconductor substrate 10. Each of the selection elements controls the flow of current passing through the memory element connected thereto.

Furthermore, the lower interconnections WL1 and WL2 may have linear shapes and extend longitudinally in a y-axis direction on the semiconductor substrate 10. In an example of this embodiment, the lower interconnections WL1 and WL2 are formed by heavily doping portions of the semiconductor substrate 10 so as to have a conductivity type opposite to that of the semiconductor substrate 10.

In the present embodiment, the selection elements include first and second semiconductor patterns P1 and P2 formed by any of the aforementioned embodiments of the method for forming the fine patterns. In other words, the first and second semiconductor patterns P1 and P2 may be formed using the hard mask layer having the first and second openings described above as an etch mask. Thus, the first and second semiconductor patterns P1 and P2 may be arranged in a zigzag pattern on the semiconductor substrate 10, and the smallest distance between the first and second semiconductor patterns P1 and P2 is less than the width of each of the first and second semiconductor patterns P1 and P2.

In addition, each of the first and second semiconductor patterns P1 and P2 may include an upper dopant region Dp and a lower dopant region Dn. The upper and lower dopant regions Dp and Dn may have conductivity types opposite to each other. For example, the lower dopant region Dn may have the same conductivity type as the lower interconnections WL1 and WL2, and the upper dopant region Dp may have a conductivity type opposite to that of the lower dopant region Dn. Thus, a PN junction is formed in each of the first and second semiconductor patterns P1 and P2. Alternatively, an intrinsic region may be interposed between the upper dopant region Dp and the lower dopant region Dn, such that a PIN junction is formed in each of the first and second semiconductor patterns P1 and P2. Accordingly, a bipolar transistor having a PNP or NPN structure may be constituted by the semiconductor substrate 10, each of the lower interconnections WL1 and WL2, and each of the first and second semiconductor patterns P1 and P2.

Lower electrodes BEC, the memory elements DS and the upper interconnections BL may be disposed on the first and second semiconductor patterns P1 and P2. The upper interconnections BL may cross over the lower interconnections WL1 and WL2 and may be disposed on the memory elements DS. The upper interconnections BL may be electrically connected to the memory elements DS.

In such a case, each of the memory elements DS may be formed to be substantially parallel to the upper interconnection BL and may be connected to a plurality of the lower electrodes BEC. Alternatively, the memory elements DS may be two-dimensionally arranged. In other words, each of the memory elements DS may be disposed on each of the first and second semiconductor patterns P1 and P2 in a one-to-one correspondence. The memory element DS may be a variable resistance pattern capable of being switched to any one of two resistance states by an electrical pulse applied to the memory element DS. In this respect, the memory element DS may include a phase-change material whose state is changed depending on the amount of current supplied thereto. Alternatively, the memory element DS may include at least one material selected from the group consisting of perovskite compounds, transition metal oxides, magnetic materials, ferromagnetic materials, and antiferromagnetic materials.

Each of the lower electrodes BEC may be disposed between each of the first and second semiconductor patterns P1 and P2 and one of the memory elements DS. A cross-sectional area of the lower electrode BEC may be less than that of each of the first and second semiconductor patterns P1 and P2 or that of the memory element DS.

In an example of this embodiment, each of the lower electrodes BEC has the shape of a pillar. However, each of the lower electrodes BEC may have a form aimed at minimizing its cross-sectional area. For example, each of the lower electrodes BEC may have a U-shape, an L-shape, a hollow cylindrical form, an annular form, or a cup-shape.

An ohmic layer may be interposed between each of the lower electrodes BEC and each of the first and second semiconductor patterns P1 and P2 in order to reduce a contact resistance therebetween. In such a case, the ohmic layer may include a metal silicide such as titanium silicide, cobalt silicide, tantalum silicide, or tungsten silicide.

Figure 23:
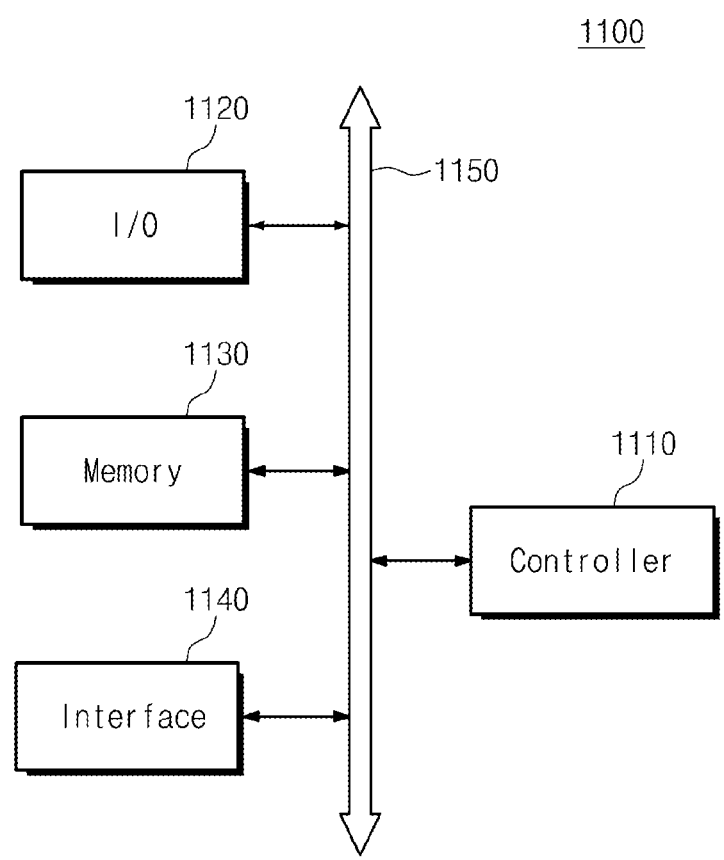
FIG. 23 is a schematic block diagram of an example of an electronic system including at least one semiconductor device formed using a method of forming fine patterns according to the inventive concept.

FIG. 23 illustrates an example of an electronic system including semiconductor devices formed using a method of forming fine patterns according to the inventive concepts.

Referring to FIG. 23, this example of an electronic system 1100 includes a controller 1110, an input/output (I/O) unit 1120, a memory device 1130, an interface unit 1140, and a data bus 1150. At least two of the controller 1110, the I/O unit 1120, the memory device 1130 and the interface unit 1140 may communicate with each other through the data bus 1150. The data bus 1150 provides a path through which electrical signals are transmitted. The controller 1110, the I/O unit 1120, the memory device 1130, and/or the interface unit 1140 may include one or more semiconductor devices fabricated according to the inventive concept.

The controller 1110 may include at least one of a microprocessor, a digital signal processor, a microcontroller, and the like. The I/O unit 1120 may include a keypad, a keyboard and/or a display unit. The memory device 1130 may store data and/or commands. The interface unit 1140 may transmit electrical data to a communications network or may receive electrical data from a communication network. The interface unit 1140 may operate by wireless or cable. For example, the interface unit 1140 may include an antenna or a transceiver. Although not shown in the drawings, the electronic system 1100 may further include a fast DRAM device and/or a fast SRAM device which acts as a cache memory for improving an operation of the controller 1110.

The electronic system 1100 may be employed by a personal digital assistant (PDA), a portable computer such as a tablet, a wireless phone or mobile phone, a digital music player, a memory card, or other electronic product that receives or transmits information data by wireless communications.

Figure 24:
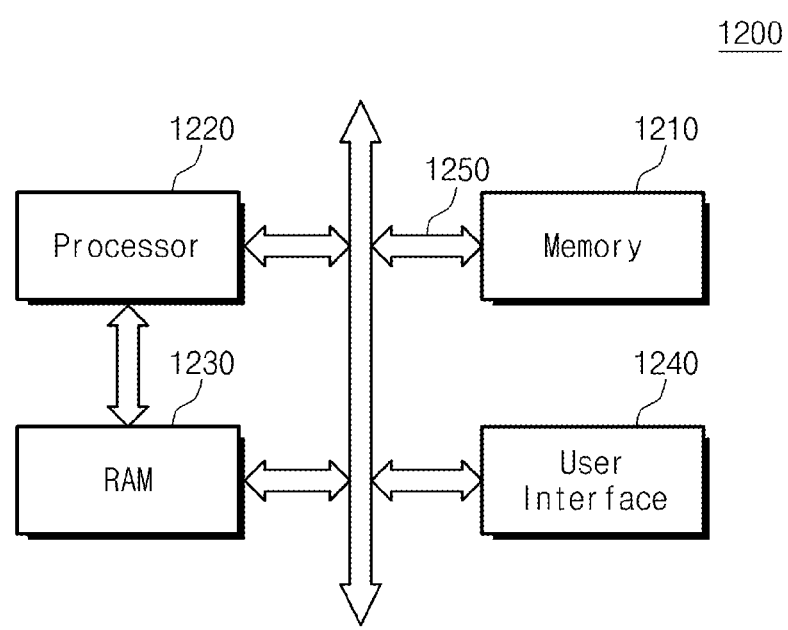
FIG. 24 is a schematic block diagram of another example of an electronic system including at least one semiconductor device formed using a method of forming fine patterns according to embodiments of the inventive concept.

FIG. 24 is illustrates another example of an electronic system including a semiconductor device formed using a method of forming fine patterns according to the inventive concepts.

Referring to FIG. 24, this example of an electronic system 1200 is that of a mobile device or a computer. In this respect, the electronic system 1200 includes a memory system 1210, a processor 1220, a random access memory (RAM) device 1230, and a user interface unit 1240 that communicate with each other through a data bus 1250. The processor 1220 may execute a program and may control the electronic system 1200. The RAM device 1230 may be used as an operation memory. The processor 1220 and the RAM device 1230 may each include one or more semiconductor devices fabricated according to the inventive concept. Also, the processor 1220 and the RAM device 1230 may be combined in one package. The user interface unit 1240 allows data to be input/output into/from the electronic system 1200. The memory system 1210 may store data outputted from an external system, data processed by the processor 1220 or a code for operating the processor 1220. The memory system 1210 may include a controller and a memory device.

The electronic system 1200 may be that of a mobile device, a personal desktop computer, or an industrial computer, or other type of device performing various logic functions. Examples of the mobile device include a personal digital assistant (PDA), a laptop computer, a web tablet, a mobile or wireless phone, a memory card, and a digital music player. If the electronic system 1200 is employed by a device capable of performing wireless communications, the electronic system 1200 may employ a communication interface protocol of a three-generation communication system CDMA, GSM, NADC, E-TDMA, WCDMA, or CDMA2000.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of forming fine patterns, the method comprising: providing a structure including a lower mask layer, a hard mask layer stacked on the lower mask layer and a buffer mask layer stacked on the hard mask layer;
patterning the hard mask layer and the buffer mask layer to form first openings therein;
forming sacrificial patterns filling the first openings, the sacrificial patterns protruding from a top surface of the buffer mask layer;
forming a spacer pattern filling spaces between sacrificial patterns adjacent to each other, the spacer pattern having gaps therein, and each of the gaps exposing a respective portion of the buffer mask layer located in a central region of a polygon whose vertices coincide with the locations of sacrificial patterns adjacent to each other, respectively;

etching portions of the buffer mask layer exposed by the gaps of the spacer pattern to form holes therein that expose the hard mask layer; etching portions of the hard mask layer exposed by the holes in the buffer mask layer to form second openings in the hard mask layer; and subsequently etching the lower mask layer using the hard mask as an etch mask.

2. The method of claim 1, wherein the smallest distance between any of the first openings and one of the second openings is less than the distance between adjacent ones of the first openings that are closest to each other, in a plan view of the first and second openings.

3. The method of claim 1, wherein the smallest distance between any of the first openings and one of the second openings is less than the width of each of the first openings, in a plan view of the first and second openings.

4. The method of claim 1, wherein the width of each of the gaps of the spacer pattern is in the range of about ⅓ to about ⅒ of the width of each of the first openings.

5. The method of claim 1, wherein the width of each of the enlarged holes formed in the buffer mask layer is greater than the width of each of the gaps of the spacer pattern.

6. The method of claim 1, wherein forming the enlarged holes comprises:
anisotropically etching the portions of the buffer mask layer exposed by the gaps of the spacer pattern to form holes exposing a top surface of the hard mask layer; and
isotropically etching the buffer mask layer exposed by the holes to increase the widths of the holes.

7. The method of claim 1, wherein forming the spacer pattern comprises:
forming a spacer layer conformally over the sacrificial patterns on the buffer mask layer to such a thickness that the spacer layer has recesses therein, each of the recesses being located within a polygon whose vertices coincide with at least three sacrificial patterns adjacent to each other, respectively; and
anisotropic ally etching the spacer layer until top surfaces of the sacrificial patterns are exposed.

8. The method of claim 7, wherein the thickness of the spacer layer is in the range of about ½ to about ¾ of the smallest distance between any two of the sacrificial patterns.

9. The method of claim 1, wherein all of the first openings are arranged in rows extending in first directions parallel to each other and columns extending in second directions perpendicular to the first directions,
the first openings in each row thereof are offset in the first direction from all of the first openings in each row adjacent thereto in the second direction, and
at least one of the first openings in each of the rows is aligned in a direction extending diagonally with respect to the first and second directions with a respective one of the first openings in each of the other rows.

10. The method of claim 1, wherein all of the first openings are disposed in rows extending in first directions parallel to each other and columns extending in second directions perpendicular to the first directions, and
each of the first openings in one of the rows is aligned in the second direction with a respective one of the first openings in each of the other rows.

11. A method of forming fine patterns, the method comprising:

providing a structure including a lower mask layer, a hard mask layer stacked on the lower mask layer and a buffer mask layer stacked on the hard mask layer;
patterning the hard mask layer and the buffer mask layer to form first openings therein;
forming sacrificial patterns filling the first openings, the sacrificial patterns protruding from a top surface of the buffer mask layer;
forming a spacer pattern filling spaces between sacrificial patterns adjacent to each other, the spacer pattern having gaps therein, and each of the gaps exposing a respective portion of the buffer mask layer located in a central region of a polygon whose vertices coincide with the locations of sacrificial patterns adjacent to each other, respectively;
anisotropically etching the buffer mask layer exposed by the gaps of the spacer pattern to form holes in the buffer mask layer;
performing an isotropic etching process on the buffer mask layer to enlarge the holes in the buffer mask layer, and wherein the enlarged holes expose the hard mask layer;
removing the spacer pattern;
after the spacer pattern is removed, anisotropically etching the hard mask layer exposed by the enlarged holes to form second openings in the hard mask layer; and subsequently anisotropically etching the lower mask layer using the hard mask layer as an etch mask.

12. The method of claim 11, wherein the enlarging of the holes using an isotropic etching process comprises increasing widths of the holes, as viewed in plan.

13. The method of claim 11, wherein the smallest distance between any of the first openings and one of the second openings is less than the distance between adjacent ones of the first openings that are closest to each other, in a plan view of the first and second openings.

14. The method of claim 11, wherein the smallest distance between any of the first openings and one of the second openings is less than the width of each of the first openings, in a plan view of the first and second openings.

15. The method of claim 11, wherein forming the spacer pattern comprises:
forming a spacer layer conformally over the sacrificial patterns on the buffer mask layer to such a thickness that the spacer layer has recesses therein, each of the recesses being located within a polygon whose vertices coincide with at least three sacrificial patterns adjacent to each other, respectively; and
anisotropically etching the spacer layer until top surfaces of the sacrificial patterns are exposed.

16. A method of forming a semiconductor device, the method comprising:
providing a target structure having a first layer disposed thereon and a second layer disposed on the first layer;
forming an array of openings through the second layer using photolithography and etching processes;
forming sacrificial patterns that have the form of pillars and occupy the openings, respectively, and wherein each of the sacrificial patterns has an upper portion protruding above a top surface of the second layer;
conformally forming a spacer layer on the protruding upper portions of the sacrificial patterns to such a thickness that the spacer layer has a portion spanning the upper portions of the sacrificial patterns and recesses are defined by the conformal spacer layer at locations between the sacrificial patterns as viewed in plan;

etching the spacer layer to extend the recesses and thereby form gaps that expose the top surface of the second layer, and etching the second layer through the gaps to form holes in the second layer;

isotropically etching the second layer to enlarge the holes in the second layer;

etching the target structure using an etch mask comprising the second layer having the enlarged holes to extend the enlarged holes into the target structure; and forming components of the semiconductor device in the holes in the target structure.

17. The method of claim 16, wherein all of the first openings are arranged in rows extending in first directions parallel to each other and columns extending in second directions perpendicular to the first directions, the first openings in each row thereof are offset in the first direction from all of the first openings in each row adjacent thereto in the second direction, and at least one of the first openings in each of the rows is aligned in a direction extending diagonally with respect to the first and second directions with a respective one of the first openings in each of the other rows, and the conformal spacer layer is formed to a thickness no greater than half the distance between adjacent ones of the first openings in each of the rows.

18. The method of claim 16, wherein all of the first openings are disposed in rows extending in first directions parallel to each other and columns extending in second directions perpendicular to the first directions, and each of the first openings in one of the rows is aligned in the second direction with a respective one of the first openings in each of the other rows, and the conformal spacer layer is formed to a thickness less than half the distance between adjacent ones of the openings along a diagonal line with respect to the first and second directions.

19. The method of claim 16, wherein the sacrificial patterns are removed from the second layer before the target structure is etched such that the target structure is etched using an etch mask comprising the second layer having the enlarged holes and the first openings to extend the first openings and the enlarged holes into the target structure.

20. The method of claim 17, wherein the sacrificial patterns are left in the first openings as the target structure is etched using an etch mask comprising the second layer.

* * * * *